United States Patent
Donaldson et al.

(10) Patent No.: US 8,843,334 B2
(45) Date of Patent: Sep. 23, 2014

(54) UTILITY METERING

(75) Inventors: James Donaldson, Oxford (GB); Malcolm McCulloch, Oxford (GB)

(73) Assignee: Isis Innovation Limited, Oxford (GB)

( * ) Notice: Subject to any disclaimer, the term of this patent is extended or adjusted under 35 U.S.C. 154(b) by 49 days.

(21) Appl. No.: 13/003,709

(22) PCT Filed: Jul. 17, 2009

(86) PCT No.: PCT/GB2009/001754
§ 371 (c)(1),
(2), (4) Date: Jan. 11, 2011

(87) PCT Pub. No.: WO2010/007369
PCT Pub. Date: Jan. 21, 2010

(65) Prior Publication Data
US 2011/0153246 A1    Jun. 23, 2011

(30) Foreign Application Priority Data

Jul. 17, 2008 (GB) .................................. 0813143.5
Oct. 28, 2008 (GB) .................................. 0819763.4
Nov. 13, 2008 (GB) .................................. 0820812.6

(51) Int. Cl.
*G01R 13/00* (2006.01)
*G01R 21/06* (2006.01)
*G01R 25/00* (2006.01)
*G01R 19/00* (2006.01)

(52) U.S. Cl.
USPC ............... 702/66; 702/61; 702/65; 324/76.11

(58) Field of Classification Search
USPC .................................. 702/65, 66, 71, 73
See application file for complete search history.

(56) References Cited

U.S. PATENT DOCUMENTS 5,270,704 A    12/1993    Sosa Quintana et al.
5,483,153 A    1/1996    Leeb et al.
(Continued)

FOREIGN PATENT DOCUMENTS

EP    1136829    9/2001
EP    1379012    1/2004
(Continued)

OTHER PUBLICATIONS

M. Akbar and D. Z. A. Khan, "Modified Nonintrusive Appliance Load Monitoring for Nonlinear Devices," Proc. IEEE Int. Multitopic Conf., Dec. 2007, pp. 1-5.*

(Continued)

*Primary Examiner* — Jonathan C Teixeira Moffat
*Assistant Examiner* — Liam R Casey
(74) *Attorney, Agent, or Firm* — Meister Seelig & Fein LLP

(57) ABSTRACT

An apparatus has an input section arranged to receive values representative of the total instantaneous supply of electrical current as a function of time from an alternating voltage supply. Current waveforms comprising sets of values representative of the cyclic waveform of the electric current supply are obtained. A delta waveform generator calculates the difference between a current waveform and an earlier current waveform. An edge detector is arranged to detect an edge or edges in the delta waveform. An analysis section is arranged to identify at least one appliance load based at least on information on the edge or edges detected by the edge detector, and to determine the electrical energy consumed by said appliance load.

21 Claims, 14 Drawing Sheets

(56) References Cited

U.S. PATENT DOCUMENTS

| | | | |
|---|---|---|---|
| 5,629,571 | A | 5/1997 | Roudeski |
| 5,696,695 | A | 12/1997 | Ehlers et al. |
| 2004/0225648 | A1 | 11/2004 | Ransom et al. |
| 2006/0091877 | A1 | 5/2006 | Robinson et al. |
| 2007/0018852 | A1 | 1/2007 | Seitz |
| 2009/0307178 | A1 | 12/2009 | Kuhns et al. |
| 2010/0070214 | A1* | 3/2010 | Hyde et al. .................. 702/61 |

FOREIGN PATENT DOCUMENTS

| | | |
|---|---|---|
| EP | 1597995 | 11/2005 |
| EP | 2026299 | 2/2009 |
| JP | 2007003296 | 11/2007 |
| WO | 2007068040 | 6/2007 |
| WO | 2008020667 | 2/2008 |
| WO | 2008025939 | 3/2008 |

OTHER PUBLICATIONS

A. I. Cole and A. Albicki, "Data Extraction for Effective Non-intrusive Identification of Residential Power Loads," Proc. of IEEE Instrumentation and Measurement Technology Conference (IMTC/98), vol. 2, May 18-21, 1998, pp. 812-815.*

J. G. Roos, I.E. Lane, E. C. Botha, G. P. Hancke, "Using Neural Networks for Non-intrusive Monitoring of Industrial Electrical Loads," Proc. of IEEE Conf. on Instrumentation and Measurement Technology, vol. 3, May 10-12, 1994, pp. 1115-1118.*

S. R. Shaw and C. R. Laughman, "A Kalman-Filter Spectral Envelope Preprocessor," IEEE Trans. Instrum. Meas., vol. 56, No. 5, Oct. 2007, pp. 2010-2017.*

George W. Hart (1992), "Nonintrusive Appliance Load Monitoring", Proceeding of the IEEE, vol. 80, No. 12, pp. 1870-1891.

International Preliminary Report on Patentability dated Jan. 27, 2011, 13 pages.

Michael Barnaski M & Voss L, "Detecting Patterns of appliances from total load data using a dynamic programming approach", Conference Proceedings Article: Proceedings of the Fourth IEEE International conference on Data Mining (ICDM'04), Published: Nov. 1, 2004, 4 pages.

Djemel Ziou, et al. "Edge Detection techniques—An Overview", pp. 1-41; and.

S. Yamagami, et al., "Non-Intrusive Submetering of Residential Gas Appliances", Ernest Orlando Lawrence Berkeley national Laboratory, Aug. 1996, 14 pages.

* cited by examiner

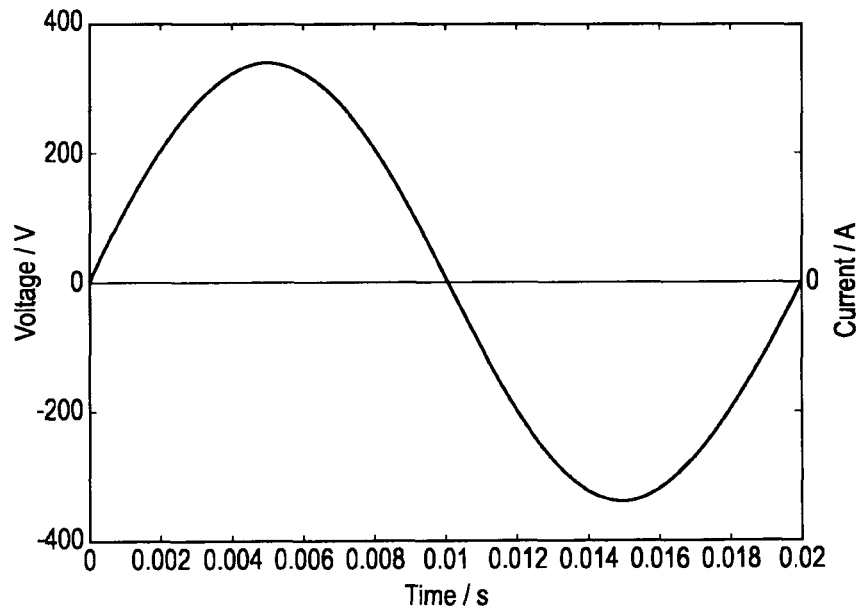
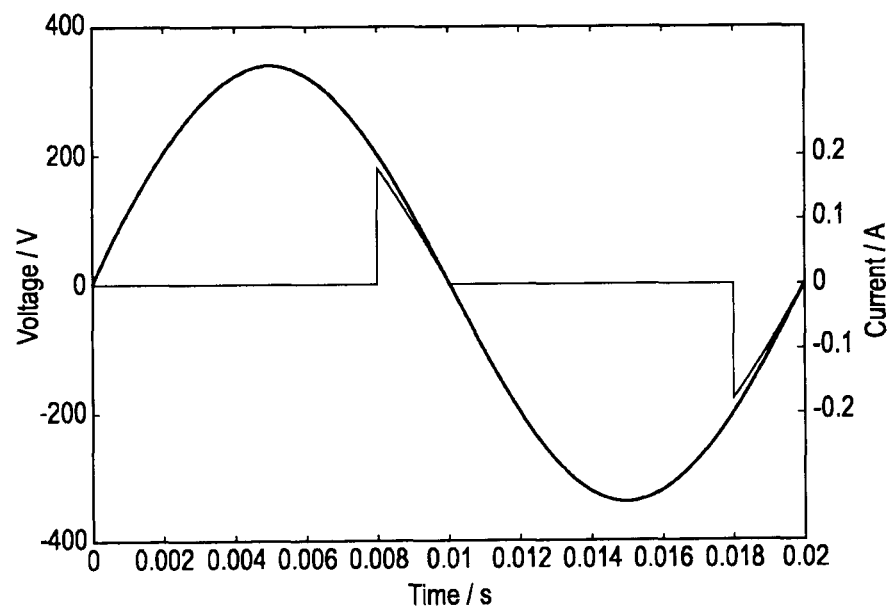

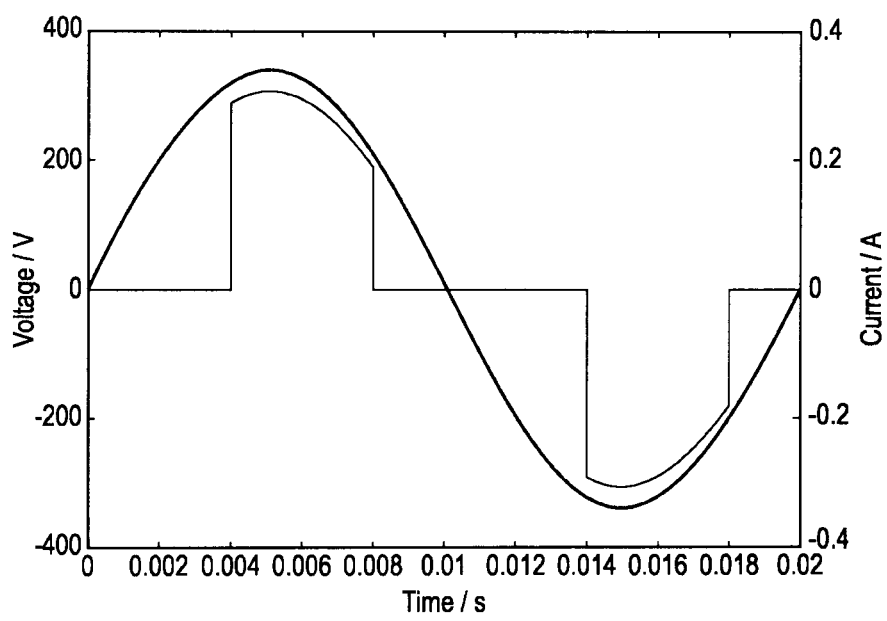

UTILITY METERING

FIELD OF THE INVENTION

The present invention concerns an apparatus for metering the use of a utility, such as electricity, gas, oil or water, supplied to one or more appliances. For example, when the utility is electricity, the present invention concerns determining the electrical power consumed by one or more individual appliances among the plurality of appliances, e.g. by detecting a variable power load.

BACKGROUND OF THE INVENTION

There is an increasing concern to reduce the consumption of resources, both at a domestic level in residential buildings, and at a commercial level in offices, shops, factories and so forth. The reasons for this are both to save costs and also because of concerns for the environment, such as the conservation of scarce resources, for example water in regions where rainfall is low, to reduce $CO_2$ emissions, and to conserve finite resources such as coal, gas and oil.

Conventionally, consumers receive bills from utility companies that may indicate the quantity of the utility used since the last bill, for example monthly or quarterly, based on periodic meter readings or even based on estimates of consumption since the last meter reading. For example, in the case of electricity supply, the information is presented to the consumer in terms of the number of kilowatt hours of electrical energy that has been used, which is meaningless to many people, and gives very little idea about how they are actually using the energy and where they can cut back. Studies have shown that the effect of providing consumers with real-time detailed information about the energy they are using is that their consumption reduces by up to 20%. In order to provide this information, it is necessary to identify where the energy drawn from this supply is ending up, i.e. which appliances are being used, how much and when. It is a problem to provide this information.

Devices are known which can be plugged into a conventional electricity outlet socket that can monitor the energy consumption by a particular appliance (an appliance will also be referred to herein more generally as an electrical load or simply a 'load') plugged into that socket. However, this information is inconvenient to obtain, and for fully monitoring the consumption at a particular site, such as a house, a separate metering device would have to be plugged into every socket to monitor every appliance, and it is generally not possible to connect such metering devices to permanently-wired appliances, such as cookers, which are typically some of the largest consumers of energy. Lighting also accounts for a significant amount of energy usage in domestic residences, for example on average 20% of the typical electricity bill in the UK is spent on lighting. Much lighting is provided in permanently wired light fittings, so a non-intrusive monitoring system is desired in this case.

Non-Intrusive Appliance Load Monitoring (NIALM) systems are known which attempt to detect signatures in the supply of the utility that are characteristic of particular appliances, including, for example, monitoring to detect events when appliances are switched on or off. For example, U.S. Pat. No. 4,858,141 (Hart et al.) discloses monitoring the voltage and current of the electricity supply to a residence to try to determine which appliances are running at any particular time and to determine the energy consumed by each.

However, distinguishing between certain types of load can be difficult in some cases.

For example, dimming devices (also called dimmer switches) are often fitted to lighting systems to allow variable control of the lighting level. These dimmer switches present a significant challenge to electricity usage monitoring systems because they transform a load that is nominally resistive and of fixed power, to a continuously variable power load, which additionally has a variable reactive power dependent on the level of dimming. There is a problem in providing a reliable way of distinguishing such loads and of measuring the power consumed by this class of device.

U.S. Pat. No. 5,483,153 (Leeb and Kirtley) discloses a 'transient event detector' that attempts to match various transient 'basis shapes' with an observed electrical waveform to assist with the appliance classification and identification process. However, there is the problem of distinguishing between appliances that have very similar characteristics with regard to consumption of electricity, for example appliances that present substantially the same electrical load. A particular problem is with heating appliances which generally have a resistive heating element which presents a purely resistive load, making it difficult to distinguish between say a toaster and a kettle. Therefore it may not be possible to separately totalize the power consumed by two 1200 W resistive appliances e.g. a toaster and a quartz space heater.

As another example, Yamagami et al., "Non-Intrusive Sub-metering of Residential Gas Appliances", Proceedings of the American Council for an Energy Efficient Economy (ACEEE) Summer Study, Pacific Grove, Calif., Aug. 25-31, 1996, 1.265-1.273, discloses accurately metering gas consumption in individual homes, then analysing the data to estimate use by particular types of gas appliance, such as cooker, stove, water heater etc. However, there is the problem of distinguishing between appliances which have very similar characteristics with regard to consumption of the same utility, for example appliances which present substantially the same electrical load.

The present invention aims to alleviate, at least partially, one or more of the above problems.

SUMMARY OF THE INVENTION

According to a first aspect of the present invention, there is provided a variable power load detector apparatus, for use in a non-intrusive electrical load meter for metering the use of electricity supplied to a plurality of loads. The apparatus comprises an input section, a monitor section, a delta waveform generator, an edge detector and an analysis section. The input section is arranged to receive values representative of the total instantaneous supply of electrical current as a function of time from an alternating voltage supply. The monitor section is arranged to determine current waveforms comprising sets of values representative of the cyclic waveform of the electric current supply. The delta waveform generator is arranged to calculate the difference between a current waveform and an earlier current waveform, by subtracting the respective sets of values determined by the monitor section, to obtain a delta waveform. The edge detector is arranged to detect an edge or edges in the delta waveform. The analysis section is arranged to identify at least one load based at least on information on the edge or edges detected by the edge detector.

According to a second aspect of the present invention, there is provided a method for detecting a variable power load, for use in non-intrusive electrical load metering, for metering the use of electricity supplied to a plurality of loads. The method comprises: receiving values representative of the total instantaneous supply of electrical current as a function of time from an alternating voltage supply; determining current waveforms comprising sets of values representative of the cyclic waveform of the electric current supply; generating a delta waveform by calculating the difference between a current waveform and an earlier current waveform, by subtracting the respective sets of waveform values; detecting an edge or edges in the delta waveform; and identifying at least one load based at least on information on the detected edge or edges.

According to a third aspect of the present invention, there is provided an apparatus for metering the use of electricity supplied to a plurality of appliances. The apparatus comprises an input section, a transient detector, an analysis section, and a processing section. The input section is arranged to receive values representative of the total supply of electrical power as a function of time. The transient detector is arranged to detect the time at which an appliance is switched on from a change in the received values due to an increase in the electric power being supplied at that time. The analysis section is arranged to analyse the received values and to determine: (i) a first value related to the resistance of said appliance at the time of being switched on detected by said transient detector; and (ii) a second value related to the resistance of said appliance when operating in a steady state. The processing section is arranged to identify said appliance based on at least said first and second values, and to determine the electrical energy consumed by said appliance.

Preferably, the analysis section is arranged to determine a further classification value related to: the total electrical energy supplied to the appliance from the time of switch on until the time steady state is reached, minus the product of the steady state power and the time from switch on until steady state is reached; and the identification of said appliance by said processing section is further based on said further classification value.

According to a fourth aspect of the present invention, there is provided an apparatus for metering the use of electricity supplied to a plurality of appliances. The apparatus comprises an input section, a transient detector, an analysis section, and a processing section. The input section is arranged to receive values representative of the total supply of electrical power as a function of time. The transient detector is arranged to detect the time at which an appliance is switched on from a change in the received values due to an increase in the electric power being supplied at that time. The analysis section is arranged to analyse the received values and to determine: (i) the time when the electrical power being used by the appliance has reached a steady state; and (ii) a classification value related to: the total electrical energy supplied to the appliance from the time of switch on until the time steady state is reached, minus the product of the steady state power and the time from switch on until steady state is reached. The processing section is arranged to identify said appliance based on at least said classification value, and to determine the total electrical energy consumed by said appliance.

According to a fifth aspect of the present invention, there is provided a method for metering the use of electricity supplied to a plurality of appliances. The method comprising: receiving values representative of the total supply of electrical power as a function of time; detecting the time at which an appliance is switched on from a change in the received values due to an increase in the electric power being supplied at that time; analysing the received values and determining: (i) a first value related to the resistance of said appliance at the time of being switched on; and (ii) a second value related to the resistance of said appliance when operating in a steady state; and identifying said appliance based on at least said first and second values, and determining the electric energy consumed by said appliance.

Preferably, the method comprises determining a further classification value related to: the total electrical energy supplied to the appliance from the time of switch on until the time steady state is reached, minus the product of the steady state power and the time from switch on until steady state is reached; and wherein the identification of said appliance is further based on said further classification value.

According to a sixth aspect of the present invention, there is provided a method for metering the use of electricity supplied to a plurality of appliances. The method comprises: receiving values representative of the total supply of electrical power as a function of time; detecting the time at which an appliance is switched on from a change in the received values due to an increase in the electric power being supplied at that time; analysing the received values and determining: (i) the time when the electrical power being used by the appliance has reached a steady state; and (ii) a classification value related to: the total electrical energy supplied to the appliance from the time of switch on until the time steady state is reached, minus the product of the steady state power and the time from switch on until steady state is reached; and identifying said appliance based on at least said classification value, and determining the total electrical energy consumed by said appliance.

The present invention has the advantage of being less computationally intensive and more accurate than previous metering apparatus and methods.

According to a seventh aspect of the present invention, there is provided an apparatus for metering the use of a utility. The apparatus comprises an input section, a processor, and an output section. The input section is arranged to receive values representative of use of a first utility. The processor is arranged to analyse the received values and to determine information on the use of a second utility based on the received values. The output section is for outputting said information.

According to an eighth aspect of the present invention, there is provided a method for metering the use of a utility. The method comprises: receiving values representative of use of a first utility; analysing the received values to determine information on the use of a second utility based on the received values; and outputting said information.

According to a ninth aspect of the present invention, there is further provided a computer program comprising computer-executable code that when executed on a computer system, causes the computer system to perform a method according to one of the second, fifth, sixth or eighth aspects of the invention.

According to a tenth aspect of the present invention, there is provided a computer-readable medium storing a computer program according to the ninth aspect of the present invention.

According to an eleventh aspect of the present invention, there is provided a computer program product comprising a signal comprising a computer program according to the ninth aspect of the present invention.

According to a twelfth aspect of the present invention, there is provided an apparatus for metering the use of a utility supplied to a plurality of appliances. The apparatus comprises an input section, a store, and a processor. The input section is arranged to receive, from a sensor, values representative of the total utility being used as a function of time, and to receive time data on the actual time of each sensed value. The store contains appliance data characteristic of the use of the utility by each of a plurality of appliances. The processor is arranged to analyse the received values and time data, based on the appliance data, and to determine information on the use of the utility by each appliance. The output section is for outputting said information. The processor is arranged to determine information on the use of the utility by each appliance based on inference of the most probable appliance or combination of appliances to be operating at a particular time and the most probable magnitude of consumption of the utility by each respective appliance, based on the received values, time data and appliance data. The inference uses an inference technique selected from Bayesian inference, neural networks, and fuzzy logic.

Advantageously, the processor is arranged to use the inference to calculate a probability of the plurality of appliances being in a particular state. More advantageously, the processor is arranged to use the inference to calculate a plurality of probabilities, each probability being a probability that the plurality of appliances are in a respective state; and the processor is further arranged to determine that the plurality of appliances are in the state with the highest probability.

BRIEF DESCRIPTION OF THE DRAWINGS

Embodiments of the invention will now be described, by way of example only, with reference to the accompanying drawings in which:

FIGS. 3(a), (b) and (c) show graphs of voltage and current waveforms for a TRIAC-controlled device, FIG. 3(a) is when the device is turned off, FIG. 3(b) is when the device is turned on at a power level below full power.

FIG. 4 shows graphs of voltage and current waveforms for a TRIAC-controlled device, FIG. 4(c) shows the change in current waveform between FIG. 4(b) and FIG. 4(a);

FIG. 5 shows graphs of voltage and current waveforms for a TRIAC-controlled device.

FIG. 7 is a graph of total power supplied to an installation as a function of time, during which an appliance is switched on;

FIG. 8 is a graph of power consumption for two different appliances from the time they are switched on;

FIG. 9 is a graph of resistance of two different appliances from the time they are switched on;

FIG. 10 is a graph of power consumption for two further different appliances from the time they are switched on;

FIG. 14(a) represents "off to dimmer", FIG. 14(b) represents "dimmer to off", FIG. 14(c) represents "dimmer increase", FIG. 14(d) represents "dimmer decrease", FIG. 14(e) represents "dimmer to fully on", and FIG. 14(f) represents "fully on to dimmer".

DETAILED DESCRIPTION OF PREFERRED EMBODIMENTS

Figure 1:
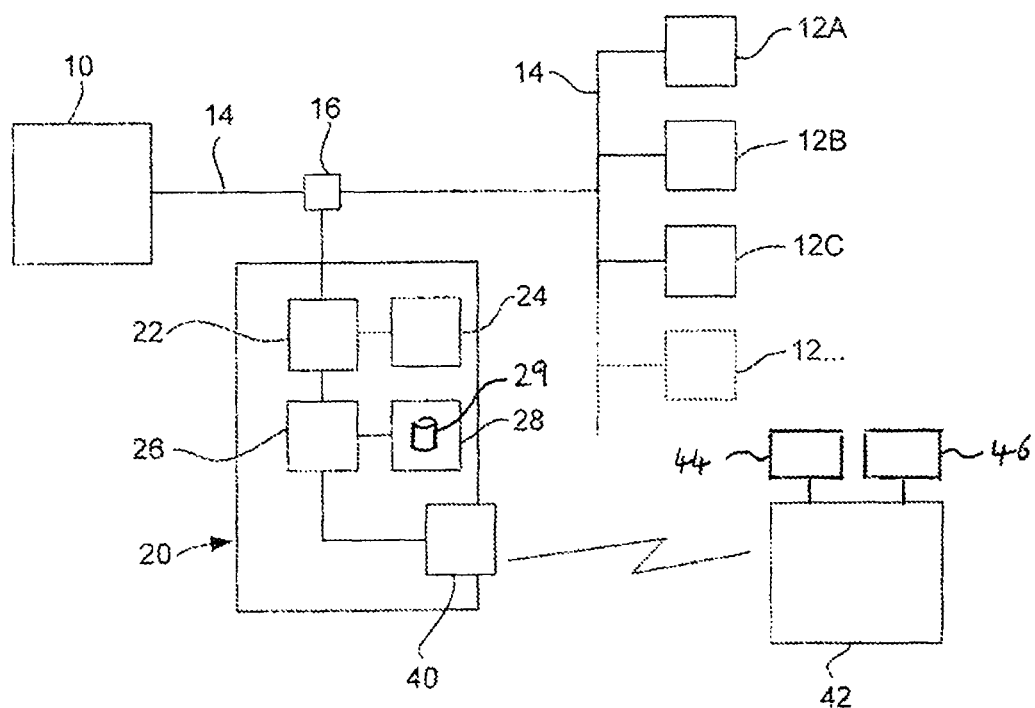
FIG. 1 depicts schematically a system using an apparatus for metering the use of electricity according to an embodiment of the invention.

An apparatus according to a first embodiment of the invention will now be described. FIG. 1 shows the hardware components of a system incorporating the apparatus for metering the use of electricity, or more correctly for metering electrical energy. The apparatus will be referred to simply as the meter.

In FIG. 1, the electricity supply to the site, for example a house, apartment, office, shop, school and so forth is denoted 10. The electricity is supplied to a plurality of appliances 12A, 12B, 12C, 12 . . . by means of conventional wiring 14. The appliances and wiring are simply shown schematically in FIG. 1, but may, of course, be configured in any appropriate way, such as via a consumer unit with circuit breakers or fuses, and with one or more ring main circuits with branches or spurs. A sensor 16 is provided to measure the total instantaneous current being provided to all of the appliances 12 from the supply 10, and also to measure the instantaneous voltage of the electricity supply 10. The current is measured by any suitable sensor, for example a current clamp placed around one of the conductors of the electricity supply wiring 14. The current clamp typically comprises a magnetizable material, such as ferrite, which forms a magnetic circuit around the conductor, and acts as a transformer to induce a voltage in a secondary winding around the magnetizable material, from which the current flowing in the supply wiring 14 can be obtained. As an alternative to this current-transformer, a Hall-effect sensor can be used to measure the magnetic field in the loop of magnetizable material around the wire which is related to the current flowing through the wire. Other suitable ways may, of course, be used for sensing the current.

The voltage of the electricity supply can also be measured by any suitable volt meter. This, of course, typically requires access to two of the conductors in the wiring 14. This can be achieved, for example, by probes which strap around the respective cables and have spikes which penetrate the insulation to make contact with the conductor. Alternatively, connections could be made to terminals in the consumer unit, or, for example, at a location where fuses or circuit breakers are insertable. Non-invasive capacitive voltage detectors could also be used.

As shown in FIG. 1, the sensor 16 is connected to the meter 20. It is, of course, possible that some or all of the sensor 16 is incorporated within the meter 20, for example that wires connect the supply wiring 14 to the meter 20, and the voltage is measured within the meter 20. Alternatively, in a different embodiment, the sensor 16 may be self-contained and may communicate with the meter wirelessly, sending analogue or digital values of the instantaneous current and instantaneous voltage. In one option, the meter 20 can derive its own power supply by virtue of being connected to the portion of the sensor 16 for measuring voltage. In one particular form of this, the meter 20 is simply plugged into an electrical outlet in the same way as an appliance 12 to obtain its power supply and also to measure the supply voltage. However, in the preferred embodiment, the meter 20 and sensor 16 are conveniently located near where the utility supply 10 enters the building, such as near where the conventional electricity meter is or would be located.

The meter 20 comprises a number of different units, namely an input section 22, a clock 24, a processor 26, a store or memory 28, and an output section 40. It is possible to implement each of the various units as dedicated hard-wired electronic circuits; however the various units do not have to be separate from each other, and could all be integrated onto a single electronic chip such as an Application Specific Integrated Circuit (ASIC) or Field Programmable Gate Array (FPGA) or Digital Signal Processor (DSP) device. Furthermore, the units can be embodied as a combination of hardware and software, and the software can be executed by any suitable general-purpose microprocessor, such that in one embodiment the meter 20 could be a conventional personal computer (PC). The software would take the form of one or more computer programs having computer instructions which, when executed by a computer (e.g. processor 26) carry out a method according to an embodiment of the present invention as discussed below. The computer programs may be stored on a computer-readable storage medium, such as a magnetic disc, optical disc (e.g. a CD or DVD), etc.

The input section 22 of the meter 20 receives current and voltage values from the sensor 16. The values are input or measured preferably multiple times per cycle of the alternating electricity supply to a level of accuracy as required by the application. If the values are supplied as analogue voltages, then the input section 22 may comprise, for example, an analogue to digital converter, such that the rest of the meter 20 can be implemented using digital electronics. The input section 22 also receives time data from the clock 24 which provides the actual present time. The clock 24 could, of course, be integral with other components of the meter, or could be part of the sensor 16, or could receive a clock signal from an external source such as a transmitter broadcasting time data. In one preferred embodiment the clock 24 comprises a quartz oscillator together with other timer circuitry that is an integral part of the processor 26 (described below). In this case, the input section 22 for receiving the time data is also an integral part of the processor 26. The processor performs a number of different functions, as described below that may be referred to by names of items, such as an edge detector and so forth; in the preferred embodiment of the invention, these items are implemented as software modules.

The store 28 stores a database 29 of information/data regarding various known electrical appliances. The power consumption of some appliances is variable. For example, a washing machine will consume considerably different amounts of power during different portions of a washing program/cycle and this will differ from program to program. All such data is retained in the memory 28 for each known appliance. The store 28 may be any suitable computer-readable storage medium, such as a solid-state computer memory, a hard drive, or a removable disc-shaped medium in which information is stored magnetically, optically or magneto-optically. The store 28, may even be remote from the meter and accessible, for example, via a telephone line or over the internet. The store 28 may be dynamically updateable, for example by downloading new appliance data. This could be done via the supply wiring 14 itself or, in one optional version, the store 28 is provided as an IC-card insertable by the user into a slot in the meter 20. Manufacturers of electrical appliances provide the necessary appliance data either directly to the consumer, or to the utility company. New IC-cards can be mailed to the user to update their meter 26. The software that the processor 26 runs to perform the analysis may also be stored in the store 28 and updated as desired in the same ways as the appliance data (e.g. by downloading, by inserting a new medium such as a disc or IC-card, and so on).

The processor 26 receives data from the input section 22, the store 28 and possibly the clock 24. The processor could be a general purpose processing device or could be a digital signal processor or could be a bespoke hardware device (e.g. FPGA or ASIC) manufactured specifically for implementing one or more embodiments of the invention. The processor 26 then performs various processing/analysis steps which are described in detail below. Following the processing/analysis, the processor 26 produces information regarding electrical energy utilisation for some or all of the appliances 12. This information may be transmitted directly to the utility provider. Alternatively, this information may be output by the output section 40 to a user terminal 42 (such as a PC or a dedicated device for utility-use feedback) so that the information can be conveniently presented to the user. The user terminal 42 can be a standard desktop or laptop computer with an attached monitor/display 44 and/or printer 46, or can be a dedicated device.

Although the meter 20 and the user terminal 42 are shown as separate devices in FIG. 1, they could, of course, be part of the same device. The output section 40 in the preferred embodiment communicates wirelessly, for example by radio frequencies (RF) link, or optically, or by infrared, or acoustically. However, it is also possible that the communication with the user terminal 42 is done through the supply wiring 14 if the user terminal 42 is plugged into one of the supply outlets as an appliance. In a further embodiment, the output section 40 can also act as a receiver, such that communication between the apparatus 20 and user terminal 42 is two-way. This enables the user terminal 42 to be used as a further means for updating the electrical appliance data in the store 28.

The voltage and current values together with the time data are received by the processor 26. From the raw data, the processor calculates a number of coefficients or signature values to characterise the present usage. Examples of coefficients or suitable signature values include, but are not limited to:

(a) the total real power consumption;

(b) the phase difference (angle) between the current and voltage which depends on the load applied by the various appliances 12 and whether it is purely resistive or also reactive, i.e. containing capacitive or inductive loads such as motors and transformers;

(c) the root-mean-squared (RMS) current.

Clearly some of the coefficients or signature values mentioned above are averages, typically over a minimum of one cycle of the electricity supply, typically supplied at 50 or 60 hertz so one cycle is approximately 0.02 seconds. However, mean values of all of the various coefficients or signature values can be calculated over a longer predetermined time interval. The present values of the coefficients or signature values are compared with the running mean value of each coefficient or signature value over the previous cycle or cycles to obtain a change or 'delta' in each coefficient or signature value.

The processor 26 then uses inference techniques to assign a probability to the state of all of the appliances 12 connected to the supply 10, in terms of whether each appliance is on or off, and the present power consumption by each appliance 12. The inference can assign a probability to the ensemble of appliances being in any particular state based on the calculated probability that the appliances were in any particular state during the previous cycle or at the previous calculation, together with the new evidence from the changes in the various coefficients or signature values calculated as described above, together with appliance data obtained from a store 28 of the meter 20. The meter 20 is not limited to knowing in advance which appliances 12 are connected to the supply. If a new appliance is added, inferences can be made regarding what that appliance is based on stored characteristics of various classes of appliance.

In one preferred form, the appliance data comprises statistical information on the probability of a specific appliance consuming a particular amount of power. For a simple appliance, such as a purely resistive load of an incandescent light bulb, then the probability of it consuming a specific amount of power, when switched on, within a small range of the nominal power, and with negligible change in the phase angle between the current and voltage, would be extremely high, approaching 100%. Thus if a change in the magnitude of the power consumption equalled approximately that value, and that light was not previously on, then the inference would be extremely likely that the new state of the appliances would include that light bulb being on.

In another preferred form, the appliance data stored in the store 28 can include information such as, but not limited to, statistical information on the probability of a specific appliance consuming a particular amount of power, information on the time of day, duration of use and interval between use of electrical energy by particular appliances, information on likely groupings of devices with increased probability of simultaneous operation, and information on the likelihood of usage and variation in energy consumption of appliances as a function of ambient temperature (where ambient temperature is included as another parameter fed to the processor).

Suitable inference techniques to perform the analysis include, for example, probabilistic methods such as Bayesian inference, classifiers such as neural networks, and possibilistic methods such as fuzzy logic. Other suitable methods may of course be used.

However, the analysis is not simply limited to monitoring on/off events of appliances. The power consumption of some appliances is variable. For example, a washing machine will consume considerably different amounts of power during different portions of a washing program and this will differ from program to program. All these power consumptions and their probabilities for each appliance are kept in the store 28 to enable the processor 26 to assign a probability to the new state of all of the appliances 12, for example using Bayes' theorem.

In this embodiment, the appliance data is in the form of a database in which, for each appliance, a probability distribution is stored for each of the above coefficients, for example in the form of a probability of the appliance operating with a power consumption within each of a plurality of ranges of power. The statistical data to derive the probability distributions can be obtained by a training process in which the appliance is operated a number of times, and the mean and variance of the coefficients are calculated. In one simple form, the appliance data for each coefficient is a top hat distribution, centred on the mean value of the coefficient and with a width of three times the variance of the coefficient in question. Outside that range, the probability is zero. Another form is a step probability distribution, for example with three levels, highest nearest the mean and stepping down on either side. Other distribution shapes can, of course, be used. It is also possible that the distribution does not have a single peak, for example in the case of an electric heater with three power settings, there would be three peaks with low probability of power consumption for values in between the three settings.

Naturally, the state of the appliances with the highest probability is assumed to be the correct present state of all of the appliances 12. A confidence-limit can also be assigned to the present state. If a new appliance 12 is connected about which the store 28 does not have information, then this will be picked up as a low confidence, in which case the meter can enter a learning mode to obtain information about the power characteristics of the new appliance, either autonomously, or by prompting the user to input new appliance information.

The above processing provides a first layer of analysis. However, it may be further refined. As a second layer, the appliance information in the store 28 also contains statistical information on the probability of each particular appliance 12 being used at any particular time of day. This could, for example, be expressed as a probability of a particular appliance being used in any specific time-slot during the day, by dividing the day into, for example, half hour intervals. This time of day probability distribution information would be included in the database of appliance data. Known inference principles can then also be applied using this extra information to assign a new probability to the state of the appliances i.e. whether any particular appliance is on or off and the power it is consuming. Thus, for example, there would be a low probability that particular lights were on during the middle of the day or that a toaster was on in the middle of the night.

A third layer of analysis can also be performed, again using inference based on the probable duration of usage of any particular appliance also stored as duration data as part of the appliance data in the store 28. Thus, it would be highly probable that a television might be in use continuously for several hours, but improbable that a kettle would be in continuous use for more than a few minutes. This duration probability distribution information would be included in the database of appliance data. Using this expected duration data, the assigned probability of the state of the appliances can be recalculated to obtain a new highest probability state configuration.

According to further preferred enhancement of this embodiment of the invention, additional evidence in the form of appliance data in the store 28 can be used to refine the state of the appliances 12. This can include information on likely groupings of devices, for example there would be an increased probability that a television set and a DVD player would be operating simultaneously, or that a computer, printer and monitor would all be operating simultaneously. Another example would be information on the stages of operation of an appliance, for example, during a washing program of a washing machine, if it has previously undergone a water-heating stage, then there would be a high probability that the machine would then enter the next stage, such as operating the motor to rotate the drum of the washing machine. Optionally, the appliance data may include other characteristics, such as data on the likelihood of the appliance being used at a range of ambient temperatures, to capture the fact that an electric heater is more likely to be used in cold weather, and an air-conditioning unit in hot weather. The meter 20 can be connected to internal and/or external temperature sensors (not shown in the figures), and can then include ambient temperature as another parameter in the inference of the state of the appliances in terms of utility usage.

In the above-described embodiment, both current and voltage of the electricity supply are measured. However, the analysis could also be done using only the current, though with potential reduction in accuracy.

In the detailed description below, a number of embodiments of the invention are described. The first embodiment relates to variable power predominantly resistive loads such as TRIAC-controlled lighting, or similar. The second embodiment relates to purely resistive devices with relatively constant steady-state loads, such as heaters. The third embodiment relates to multi-utility analysis (e.g. analysis of both electricity and water usage). It should be noted that the three embodiments described below may be used together or in isolation.

Variable Power Predominantly Resistive Loads (e.g. TRIAC-Controlled Lighting)

Using the basic signature value information from the electricity supply signals together with inference techniques can successfully discriminate between a large number of different appliances 12. Embodiments of the present invention are particularly concerned with detecting variable power predominantly resistive loads, such as TRIAC-controlled lighting, determining the energy consumption by such loads, and tracking separately each such load when more than one is present. The following description uses the particular example of a dimmer switch controlling an incandescent light. It is, of course, understood that in this context "resistive" refers to the voltage and current flowing through the load being substantially in phase with each other; the load need not necessarily be ohmic nor linear. Similarly, the invention preferably applies to detecting devices employing intra-cycle switching to variably control the power supplied to a load. The TRIAC is just one specific example of a controlled switch for such devices; other examples include: SCRs (silicon-controlled rectifiers), thyristors and transistors.

Some background to the operation of this embodiment of the invention is described below.

Figure 2:
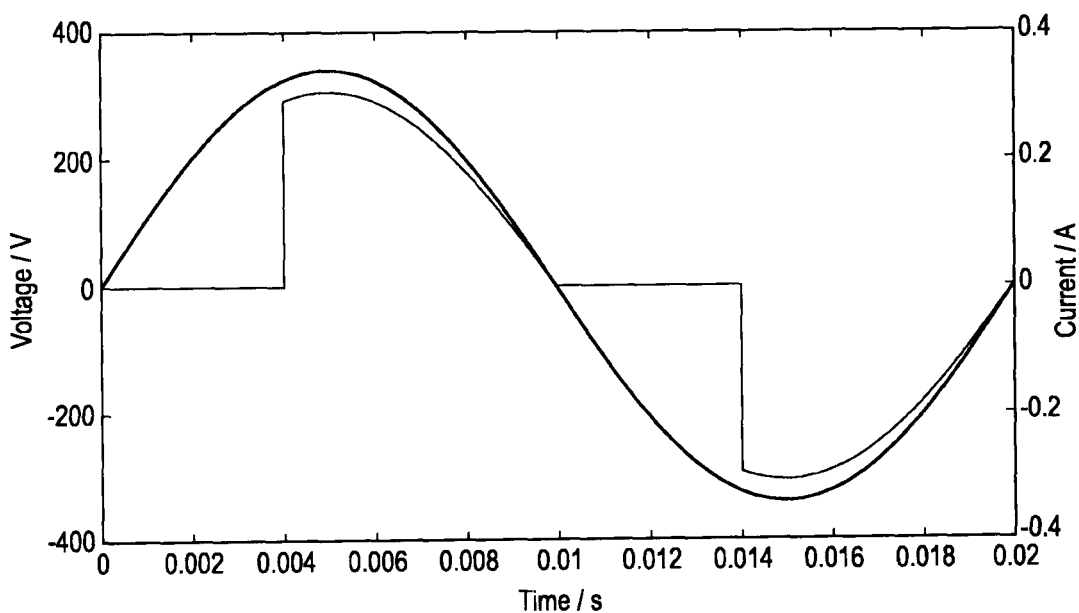
FIG. 2 is a graph of voltage and current waveforms over one cycle of an alternating supply for a TRIAC-controlled load.

A modern dimmer switch uses a TRIAC semiconductor device. This is a non-linear device that is only turned on for a portion of the electrical cycle. FIG. 2 shows the voltage and current waveforms for an idealised dimmer switch controlled incandescent light running at just over half power. The voltage waveform in FIG. 2 (and each of FIGS. 3-5) is the sinusoidal waveform and is shown for one cycle of the alternating electricity supply. For the early part of the cycle, no current is drawn, then at a particular point the TRIAC is triggered and starts conducting such that there is a step change in current flow. The current then flows (approximately proportional to the voltage) for the remainder of the half cycle until the voltage changes polarity (at a zero-crossing of the voltage waveform) at which the TRIAC stops conducting. The second half cycle is then the same as the first half cycle, just with the opposite polarity. When the TRIAC is not conducting, no voltage is applied across the load itself; the voltage waveform shown is that from the supply which is applied across the TRIAC circuit driving the load.

The point at which the TRIAC turns on can be continuously varied, typically by adjusting a variable resistor associated with the TRIAC circuit, generally from anywhere from the beginning to the end of the half cycle. The point at which the conduction begins will be referred to as a phase angle in radians in terms of the cycle of the alternating supply, and is also called the "firing angle". The firing angle can be anything from 0 to $\pi$ and in FIG. 2 it is somewhere between $\pi/4$ and $\pi/2$. By varying the firing angle, the power consumption can be varied from substantially zero to substantially 100% of the nominal power rating of the lighting load.

Broadly, there are six scenarios that are of interest with regards the state changes of dimmer controlled lighting systems. These are:—

1. From off to dimmer setting
2. Increase in power to higher brightness
3. From dimmer setting to fully on
4. From fully on to dimmer setting
5. Decrease in power to lower brightness
6. From dimmer setting to off The trivial case of off to fully on (and fully on to off) is omitted because this is already covered by methods concerned with a purely resistive load.

Waveforms for the first three scenarios are discussed below with reference to FIGS. 3, 4 and 5. The second three scenarios are identical to the first three except that, the delta waveforms are inverted. In each of FIGS. 3, 4 and 5, the first and second Figures (a) and (b) show the waveforms before and after, respectively, the change with which that particular scenario is concerned. The third graph (c) in each figure is the delta waveform of the current obtained by subtracting the current waveform (a) from the current waveform in (b); the sinusoidal voltage waveform is shown superimposed for reference. Of course, the waveforms shown in (a) and (b) for each figure are idealised, and represent the current for a single TRIAC-controlled load. In practice, many other appliances will be operating with a significant baseload, so the waveforms will be much more complicated, however, by subtracting to obtain the delta waveform, the baseload is removed, and the current change due solely to the TRIAC-controlled device is obtained.

The following description also makes use of the gradient of the delta waveform and denotes this simply as "d/dt".

In embodiments of the invention it is necessary to detect the sharp 'turn on' and 'turn off' edges of the waveform and the deltas. The methods of detecting these will be covered in a later section. Note that in the following text, when we refer to edges, these are the edges in the first half of the cycle. For every edge in the first cycle, there will be a corresponding edge in the second half of the cycle which is of opposite polarity.

1) a TRIAC Type Device Turns on—FIG. 3.

Figure 3C:
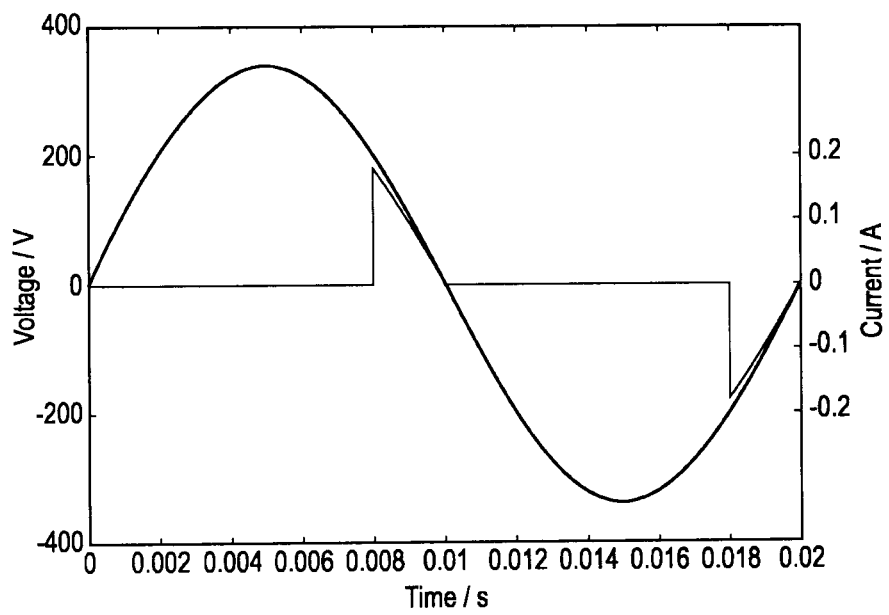
FIG. 3(c) shows the change in current waveform between FIG. 3(b) and FIG. 3(a)

In this case, the delta waveform FIG. 3(c) shows a single edge with d/dt>0. This is at firing angle $\alpha_{on}$ The change in real power is positive.

Figure 4A:
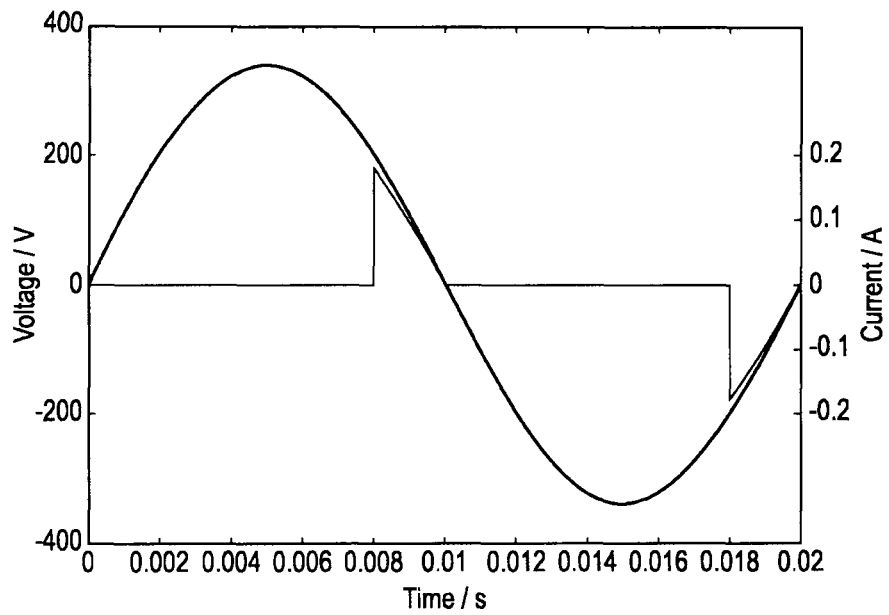
FIG. 4(a) is when the device is at an initial power setting.
Figure 4B:
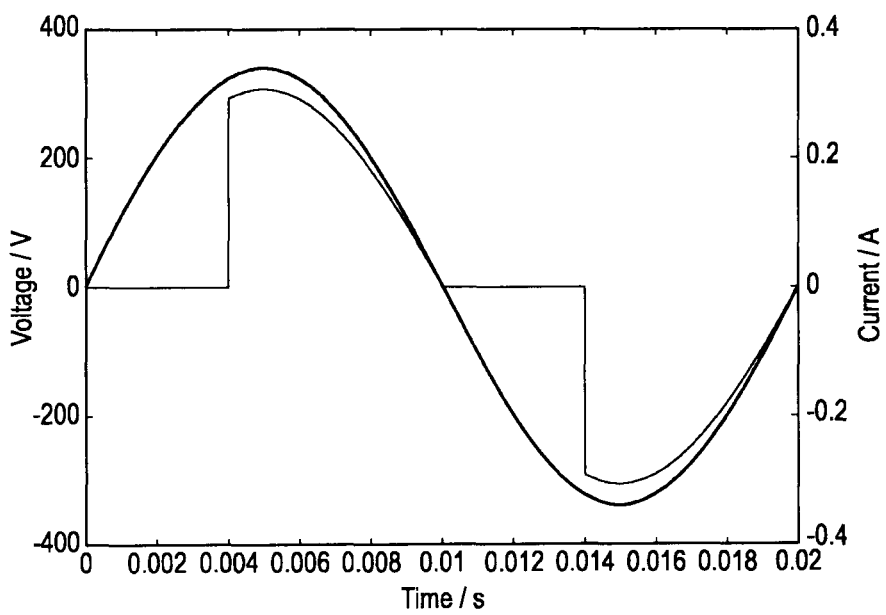
FIG. 4(b) is when the device is turned up to an increased power level but below full power.

2) a TRIAC Type Device Increases in Power Consumption—FIG. 4.

In this case, the delta waveform FIG. 4(c) shows two edges. The first has d/dt>0 and is at $\alpha_{on}$. The second has d/dt<0. Note that the position of this edge is identical to the '$\alpha_{on}$' from section one.

The change in real power is positive.

Figure 5A:
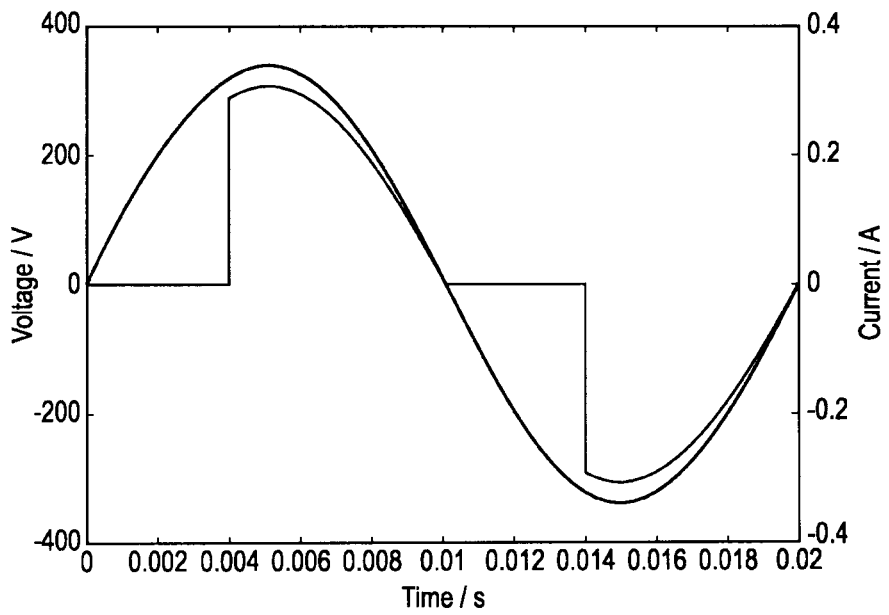
FIG. 5(a) is when the device is at an initial power setting.
Figure 5B:
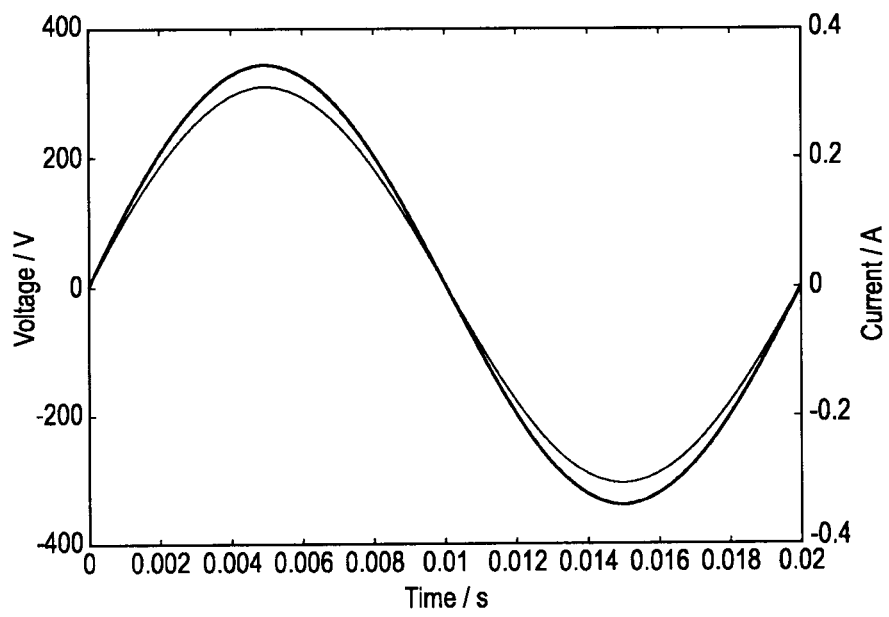
FIG. 5(b) is when the device is turned up to full power.
Figure 5C:
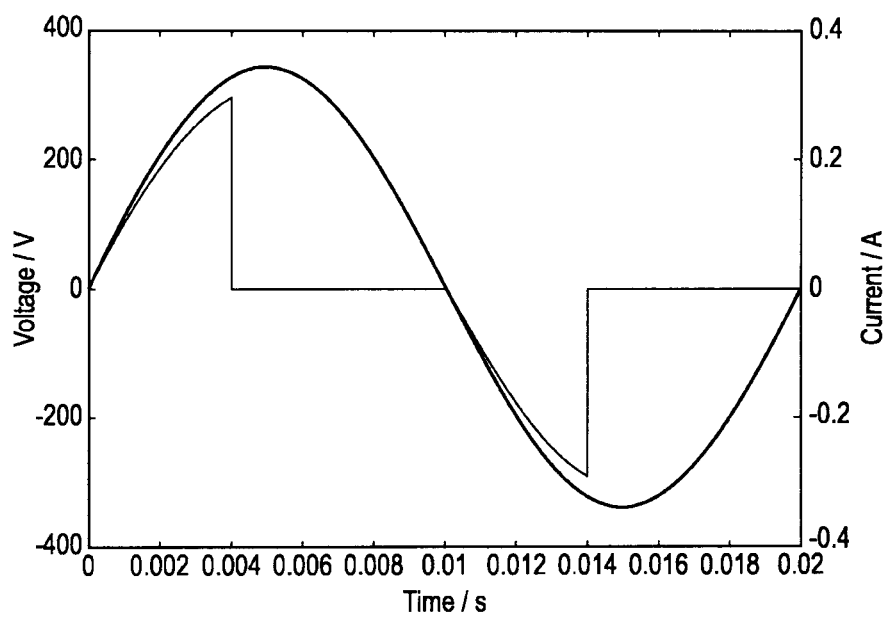
FIG. 5(c) shows the change in current waveform between FIG. 5(b) and FIG. 5(a)

3) a TRIAC Type Device Increases in Power Consumption to Fully on—FIG. 5.

In this case, the delta waveform shows a single edge with d/dt<0. The change in real power is positive.

TABLE 1

Summary of the Scenarios

Figure 14A:
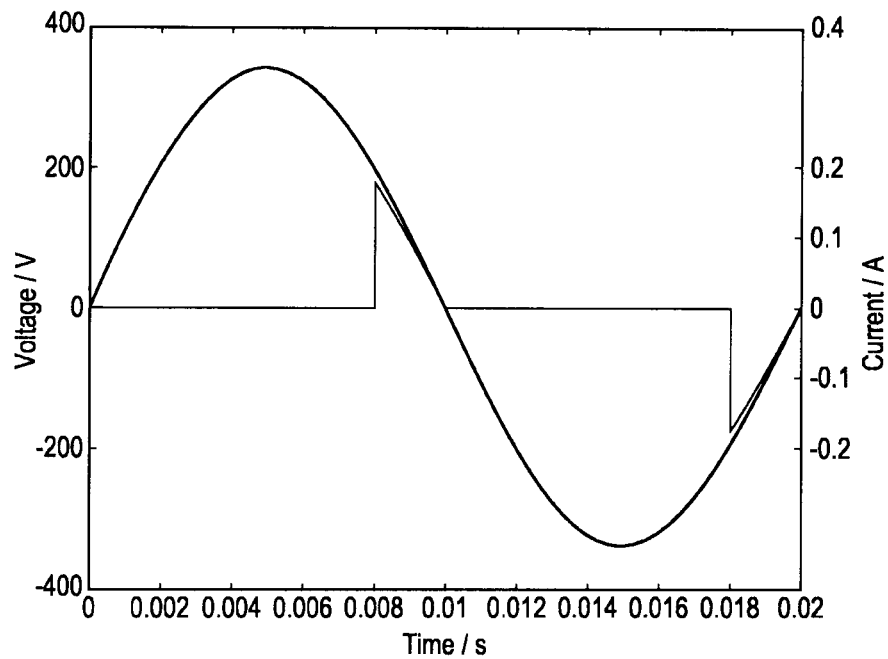
FIGS. 14(a)-(f) show graphs of voltage and current waveforms for a dimmer-controlled lighting system using a TRIAC semiconductor device.
Figure 14B:
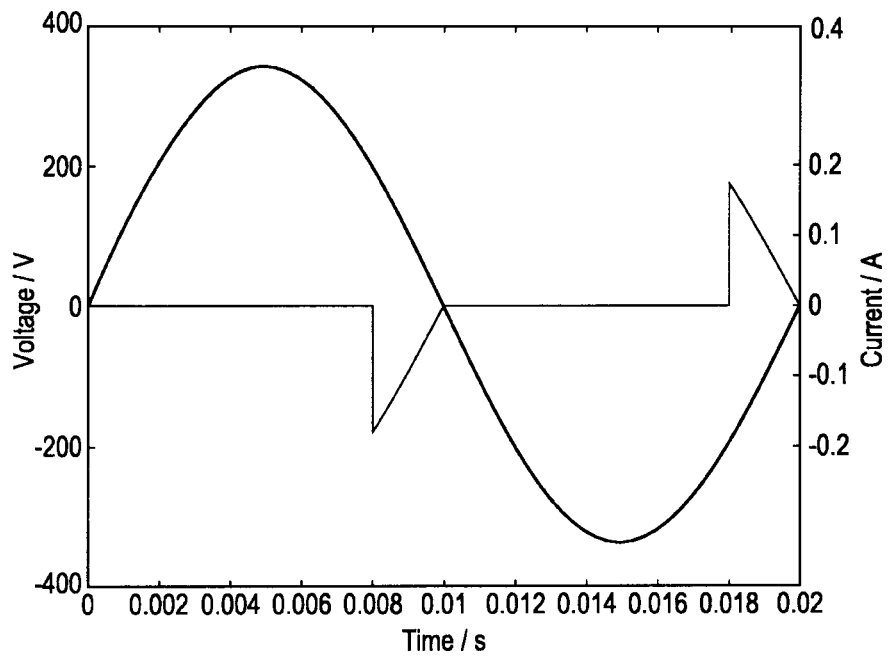
Figure 14C:
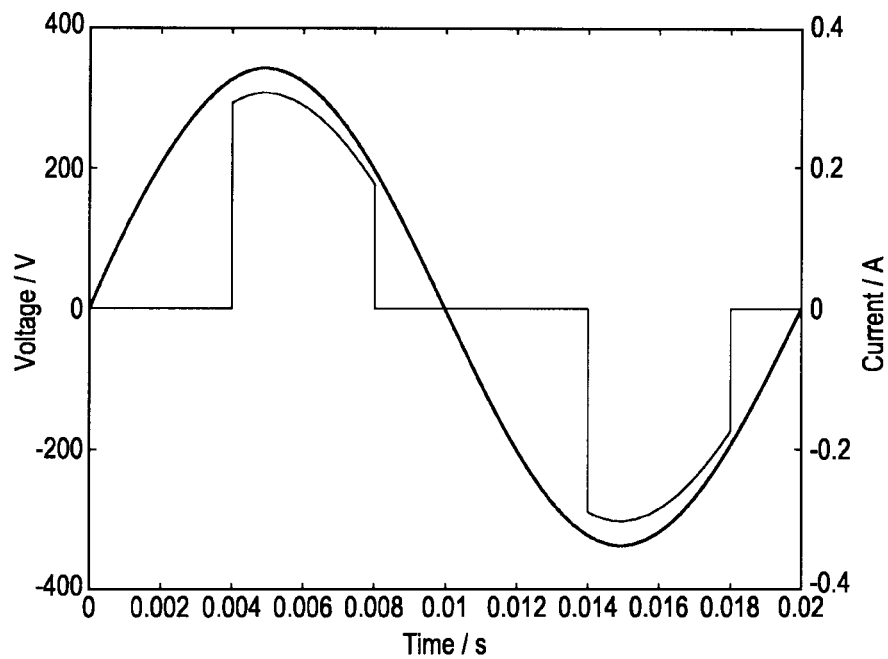
Figure 14D:
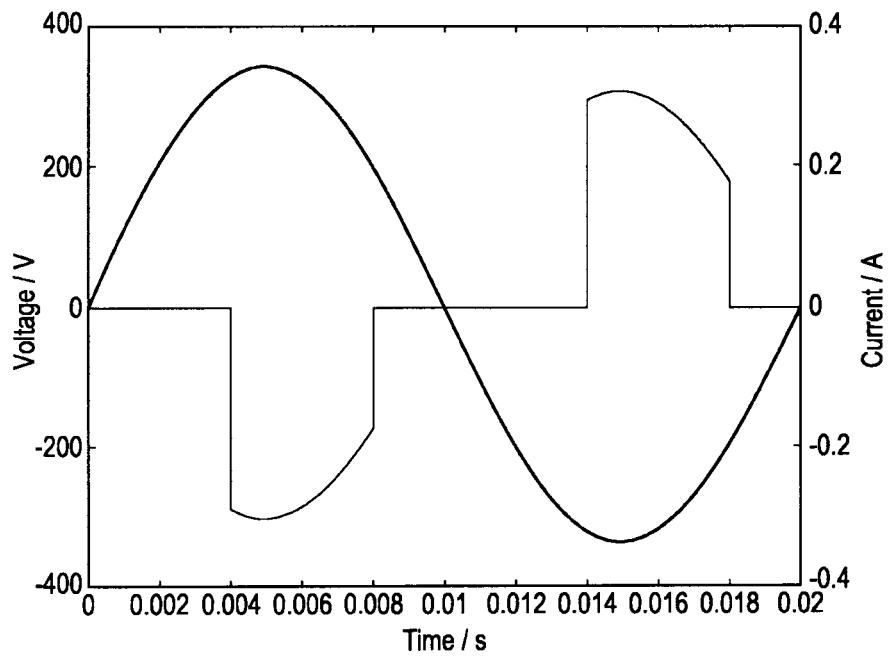
Figure 14E:
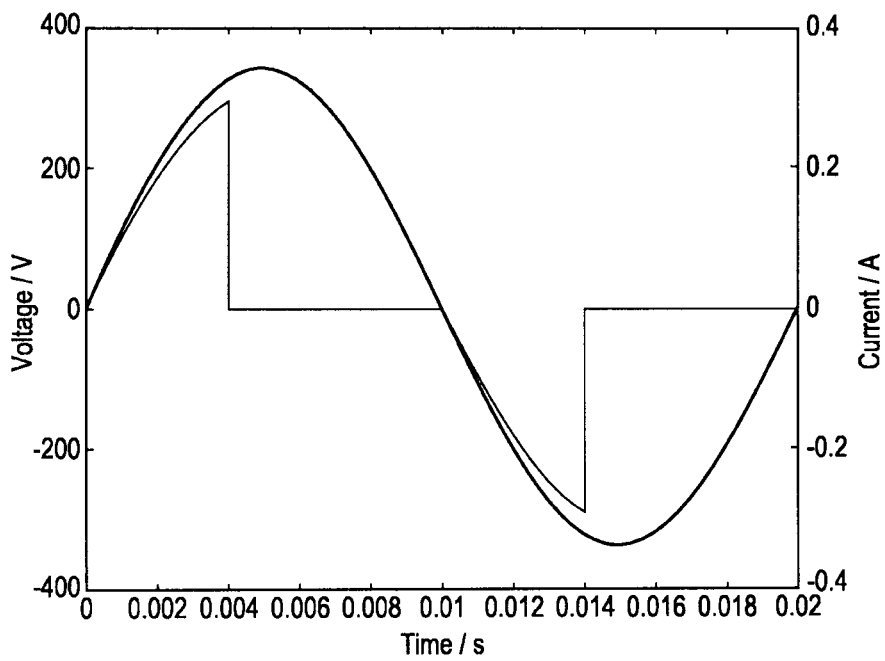
Figure 14F:
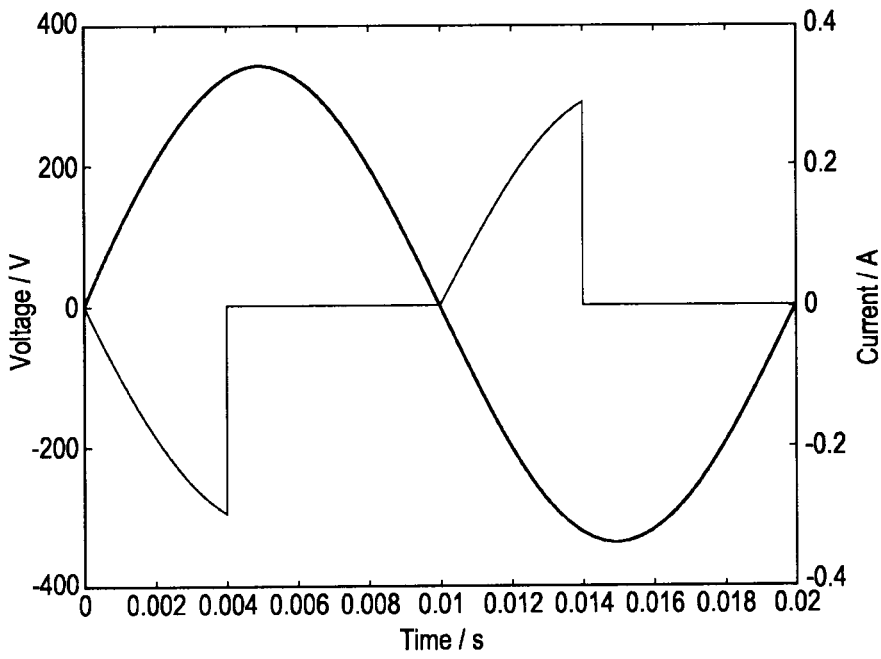

| Scenario | Waveform Delta | First Edge d/dt | Second Edge d/dt | Change in Real Power |
|---|---|---|---|---|
| 1. Off to dimmer | See Fig. 14(a) | >0 | N/A | +ve |
| 2. Dimmer to off | See Fig. 14(b) | <0 | N/A | −ve |
| 3. Dimmer increase | See Fig. 14(c) | >0 | <0 | +ve |
| 4. Dimmer decrease | See Fig. 14(d) | <0 | >0 | −ve |
| 5. Dimmer to fully on | See Fig. 14(e) | <0 | N/A | +ve |
| 6. Fully on to dimmer | See Fig. 14(f) | >0 | N/A | −ve |

Thus it can be seen that by considering the number of edges in the delta waveform, the polarity of those edges and the change in real power associated with the delta, that we can fully detect each scenario.

Identification of the device which has changed power consumption is described below.

In most domestic residences, there are multiple loads controlled by dimmer switches and each load can have a different full power. For an advanced and accurate NIALM system, it is necessary to not only apportion the change in power to a class of loads 'lighting' but in actual fact to track the power consumption of individual loads.

Following the detection of a TRIAC event, the first stage is to calculate the full power load of that device. By doing this, we can identify the difference between say a 100 W load @ 30% power compared to a 60 W load @ 50% power.

To do this is non-trivial. One method is to calculate the power consumption of the device by the integral of the power and hence relate the total power consumption to the firing angle of the TRIAC . . . .

$$P = \frac{1}{2\pi} \int_0^{2\pi} V.I.d(\omega t) = \frac{1}{2\pi} \int_\alpha^\beta v_0 \sin(\omega t) \cdot i_0 \sin(\omega t) d(\omega t)$$

where $\alpha$ is the turn on point and $\beta$ is the turn off point.

However, this may be wildly inaccurate in some circumstances on account of the non-linearity of the load with firing angle.

Instead, a preferred way is to calculate the 'effective voltage' that the load sees.

The effective RMS voltage as seen by the TRIAC-controlled load can be calculated as follows $$(V_{RMS-E})^2 = \frac{1}{2\pi} \int_\alpha^\beta v_0^2 \sin^2(\omega t) d(\omega t)$$

Which leads to a solution . . .

$$(V_{RMS-E})^2 = \frac{v_0^2}{2\pi} \{\pi - \alpha + 0.5\sin(2\alpha)\} \quad (1)$$

when $\beta=\pi$; this corresponds to the case when we turn a TRIAC on. (i.e. it was previously off.)

$v_0$ is the peak of the voltage supply (equal to the actual RMS line voltage$\times\sqrt{2}$).

The power consumed by a perfectly resistive load is proportional to the square of the rms voltage—the constant of proportionality being 1/resistance. In actual fact, in the case of an incandescent bulb, the power is proportional to the rms Voltage to the power approximately 1.5.

Knowing this relationship, it is thus possible, given the power of a light and the effective RMS voltage applied to calculate the power that would be consumed at the nominal line voltage (240V RMS in the UK) according to the following formula . . .

$$P_{Norm} = P_{Observed} \times \frac{V_{RMS-LINE}^\gamma}{V_{RMS-E}^\gamma} \quad (2)$$

where $\gamma$ is approximately equal to 1.5 and $V_{RMS-LINE}$ is the RMS line voltage of the supply (nominally 240V in the UK.)

Thus, when a TRIAC turns on (scenario 1 above), we know the peak voltage, the firing angle ($\alpha$) and $P_{Observed}$ (which is the power delta) and thus can work out the nominal power of the load.

This is useful in the two cases where we turn the TRIAC on and off, but we can generalise further . . . .

Consider that we turn on a TRIAC controlled load, with firing angle $\alpha_1$ and power change $\Delta P_1$. Using this information, we can calculate the effective RMS voltage and thus the nominal power of the load.

Rearranging equation (2) above leads to $$\Delta P_1 = \frac{V_{\alpha 1}^\gamma}{V_{RMS-LINE}^\gamma} \times P_{Norm} \quad (3)$$

where $V_{\alpha 1}$ is the effective RMS voltage delivered when the firing angle is $\alpha 1$.

We now increase the power to the load by decreasing the TRIAC's firing angle. The observed power change is $\Delta P_2$, the firing angle is $\alpha_2$ and the total power being delivered to the load is $(\Delta P_2+\Delta P_1)$ We can calculate the effective RMS voltage as seen by the load and this is denoted $V_{\alpha 2}$. Substituting into equation (2) above gives $$P_{Norm} = (\Delta P_1 + \Delta P_2) \times \frac{V_{RMS-LINE}^\gamma}{V_{\alpha 2}^\gamma} \quad (4)$$

Substituting in equation (4) above and rearranging gives the expression $$P_{Norm} = \Delta P_2 \times \frac{V_{RMS-LINE}^\gamma}{V_{\alpha 2}^\gamma - V_{\alpha 1}^\gamma} \quad (5)$$

Thus for any change in state of the TRIAC, we can calculate the nominal power of the load and thus identify the load being controlled. Corresponding expressions can be derived for loads controlled by SCRs or other types of controlled switches.

(Note, when turning a TRIAC on, $\Delta P_2$ is the observed power change, and $V_{\alpha 1}$ is zero.)

In addition to calculating a value for $P_{Norm}$, equation 5 can also be used to derive the value of $\gamma$. Following the change in state of a triac-controlled load the values of $\alpha 1$ and $\alpha 2$ and $\Delta P_2$ are known. These can then be stored awaiting a further change in state of this load. Following a further change in state of this load, one can solve for $\gamma$ since $P_{Norm}$ will be the same in both cases. Thus $\gamma$ is the only unknown and can be solved by conventional mathematical techniques. It is of course possible to calculate $\gamma$ from multiple data points to further increase accuracy. One can simultaneously solve for $P_{Norm}$ using equation (5) and thus use $P_{Norm}$ to match up state changes to the same appliance. In the event that $P_{Norm}$ is unknown, one can instead match up unknown events to an appliance based on prior knowledge of the state of that appliance, for example from the firing angle.

Additionally, in certain cases where there are multiple loads under TRIAC control, one can further aid identification by considering the positions of the edges. A summary of methods for identifying the specific load following a TRIAC event are shown below in Table 2.

TABLE 2

| Scenario | Waveform Delta | Methods for identification of device |
|---|---|---|
| 1. Off to dimmer | See FIG. 14(a) | Calculate the nominal power of the load based on firing angle. The load must have been previously off. |
| 2. Dimmer to off | See FIG. 14(b) | Calculate the nominal power of the load based on firing angle. In the case that there are multiple loads of this power on, can identify specific load by matching the position of the edge with the last known firing angle. |
| 3. Dimmer increase | See FIG. 14(c) | Calculate the nominal power of the load based on firing angle. In the case that there are multiple loads of this power on, can identify specific load by matching the position of the −ve edge with the last known firing angles. The new firing angle is given by the position of the +ve edge. |
| 4. Dimmer decrease | See FIG. 14(d) | Calculate the nominal power of the load based on firing angle. In the case that there are multiple loads of this power on, can identify specific load by matching the position of the −ve edge with the last known firing angles. The new firing angle is given by the position of the +ve edge. |
| 5. Dimmer to fully on | See FIG. 14(e) | Calculate the nominal power of the load based on firing angle. In the case that there are multiple loads of this power on, can identify specific load by matching the position of the −ve edge with the last known firing angles. The new firing angle is 0 degrees once the dimmer is fully on. |
| 6. Fully on to dimmer | See FIG. 14(f) | Calculate the nominal power of the load based on the firing angle. In the case that there are multiple loads of this power, one can restrict the search to devices which are known to be fully on. |

Edge detection is described in detail below.

As is apparent, it is necessary to accurately detect the edges in the signal. There is a vast body of literature available with regards edge detection algorithms. Any of these known edge detection algorithms may be used to detect edge(s) in the delta waveform described above. However, accuracy can be improved in this system through three mechanisms . . .

1: By employing a sensor/pre-processing stage that removes DC offset from the current signal, we can be assured that prior to a positive edge, the average value of the current delta must be zero, or close to zero such that the magnitude of the difference from zero is below a threshold value (i.e. approximately zero). Similarly, following a negative edge, the average value of the current delta must be approximately zero. These statements apply when either: (i) the edge is in the first half of the waveform and the change in real power is positive; or (ii) the edge is in the second half of the waveform and the change in real power is negative. For the cases of (iii) an edge in the first half of the waveform and a negative change in real power or (iv) the edge in the second half of the waveform and a positive change in real power, then a positive edge should be followed by an approximately zero value of the current delta, and a negative edge should be preceded by an approximately zero value of the current delta. Thus, by measuring the current delta value either side of the edge, one can improve the accuracy of detected edges and thus reject noise and other signal artefacts that would otherwise be mis-identified as a TRIAC turning on.

2: One can assume that as long as the total power measured by the monitor is stable, then the position of the edges are constant. Edges due to noise etc. will not be constant assuming random noise patterns and hence once can average the results over multiple cycles to improve accuracy, either by taking an average of the current delta waveform, or alternatively by running the edge detection algorithm and averaging the results.

3: Assuming that there is no DC offset, the system should exhibit symmetry—for every edge $\alpha 1$ measured in the first half of the cycle ($0 < \alpha 1 < \pi$), there will be another edge $\alpha 2$ in the second half of the cycle $\alpha 2$, where $\pi < \alpha 2 < 2\pi$ and $\alpha 2 - \pi = \alpha 1$.

In reality, it is possible that $\alpha 2 - \pi$ does not exactly equal al due to imperfections in the system and the devices, hence, the algorithm should be tolerant to small deviations.

There are other techniques which could also be applied to complement or replace the standard (albeit improved) methods of edge detection described above. One such alternative or additional edge detection technique is described below, in which the first 'turn on' edge is referred to as $\alpha$ and the second 'turn off' edge is referred to as $\gamma$.

As mentioned above, TRIACS are used to provide variable power control for electrical systems. They work by gating the voltage supplied to the appliance between the start of the electrical cycle (0°) and a variable point between 0° and 180° degrees in that cycle, with 0° corresponding to full power and 180° corresponding to zero power. As described above, the characteristic 'gated sine wave' pattern in the current waveform is detected indirectly by looking for edges. However, one could also look for the characteristic 'gated sine wave' pattern by quantifying a measure of similarity between the waveform under analysis and a reference waveform. One such measure of similarity could be the correlation coefficient which measures the strength of a linear relationship between two variables.

Thus, one possible approach would be to create a set of basis waveforms consisting of a set of gated sine waves comprising every possible value of $\alpha$ and $\gamma$. For a waveform comprising N points, this set would have $N^2$ members. Correlations could then be performed between the candidate waveform delta and each of our basis waveforms and the highest correlation would correspond to the closest match.

Since the delta waveform may be caused by a non-TRIAC device, it would be advantageous to have a "reject" option where, if the correlation coefficient was not high enough, then such an event would be rejected as a possible TRIAC event.

In addition, the correlation coefficient should preferably be modified by a term relating to the size of the correlation window ($\alpha - \gamma$) since the smaller the window, the more likely a high correlation coefficient due to random noise. A possibly modification term would be $\sqrt{N}$ though any function that increases with N could be used.

It would also be possible to correlate with other gated functions. The most appropriate for a resistive device being controlled by a TRIAC would be a gated voltage waveform since, for a purely resistive device, the current drawn by that device is directly proportional to the supply voltage. Since the supply voltage is often not sinusoidal, such a technique can yield better results.

The correlation operation is of order N which means that, in order to correlate against the full set of basis waveforms, the computation time is of order $N^3$. It would be possible to reduce the computation time (and therefore speed up the system somewhat) by reducing the search space. For example, there is a constraint that $\alpha$ is less than $\gamma$, which can reduce the search space by half. Moreover, one could run a more standard edge detection algorithm (as referred to above) in conjunction with this correlation technique for detecting the edges. By identifying candidate edges, one can vastly reduce the search space to look over. Advantageously, by using this correlation technique in combination with the edge detection described above, one can improve the resilience of the system to rogue edges which may occur in a noisy system.

The Operation of an Embodiment of the Invention is Described Below.

Figure 6:
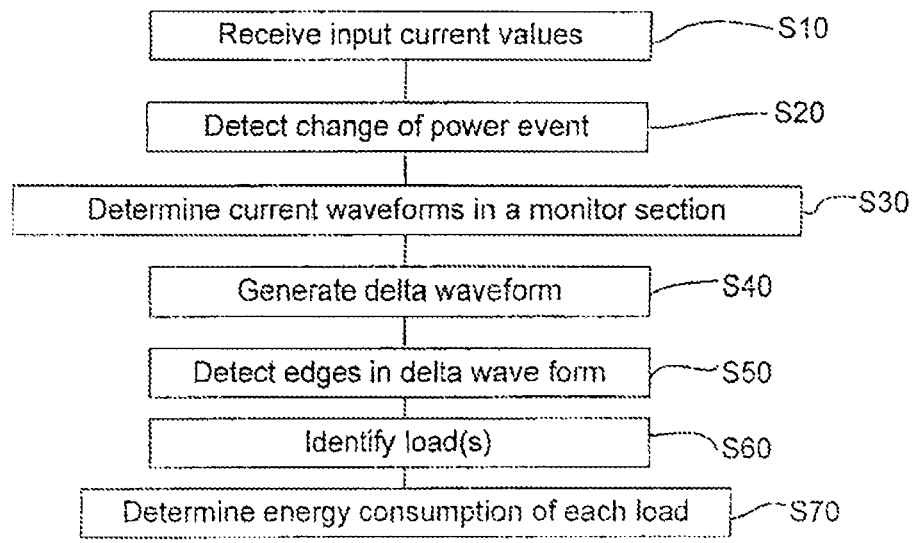
FIG. 6 is a schematic flow chart of a method embodying the invention.

The following processes, described with reference to the flow chart of FIG. 6, are carried out by one example of an apparatus embodying the invention. The processes may be performed by the general processor 26 for example as software modules, or may be implemented in hard-wired dedicated hardware.

Measure signature values of interest (based on instantaneous current and voltage values received at an input section, step S10) at a pre-determined rate (at a rate of every cycle, or slower. One could also average over multiple cycles. To date, Real Power has proved to be the most reliable signature, but there are others) to monitor whether the background load is 'stable' (i.e. inter-cycle variation in the measured signatures is below some pre-determined power). If the signature is deemed to be stable, then it can be assumed that there has been no change in the power signatures as drawn by all appliances on the supply and this stable signature is recorded along with the current waveform.

If there has been a change in signature(s), then we assume that an appliance has changed the amount of power that it is drawing. A change in signature (such as the amount of power) is detected by an event detector in step S20. We may then run multiple analyses designed to detect specific appliance classes and compare the results from each classifier to identify which appliance has changed state. The following describes, by way of example, a classifier to detect variable power loads, such as lighting circuits.

A monitor section determines current waveforms in step S30. The 'stable' current waveform can be a single waveform preceding the detected event or can be a weighted mean of preceding waveforms. The weighted mean can be a simple average (i.e. all weights equal 1) or can place greater weight for example on more recent samples. The waveform after the detected event can also either be a single waveform or a weighted average. In step S40 a delta waveform generator then calculates the 'current delta' waveform by subtracting each sample of the 'stable' current waveform from the present current waveform (after the detected event).

An edge detector then analyses the delta waveform to look for edges in step S50. A simple method would be to threshold on d/dt. A more advanced method looks for areas of local maximum in d/dt (i.e. the differential at a sample is greater than the samples either side) or by looking at zero crossings in the second derivative. For more details, reference 'Edge Detection Techniques—An Overview.' By Ziou and Tabbone. To improve the detection of edges, the waveform may first be filtered to remove noise.

If one or more edges are detected, two further checks can be made.

1: If d/dt is positive, then the delta current level between the zero crossing preceding the edge of the waveform and the edge should be approximately zero. This can be calculated by numerous methods:—e.g. one could check that the magnitude of each sample is below the maximum noise level of the system. Alternatively, one could average or integrate the current prior to the edge and check that this is below the expected noise level.

Similarly, if d/dt is negative, then the current following the edge should be approximately zero.

As explained previously, and as is apparent from Table 1, these statements apply to edges in the first half of the waveform for situations in which the change in real power is positive (scenarios 1, 3 and 5). The polarity of the edges should be reversed for scenarios 2, 4, 6, and reversed (again) for edges in the second half of the waveform.

2: To improve accuracy, one can look over multiple cycles. As long as the signal is stable, then the edges should remain in the same position from cycle to cycle. Thus, one can remove false edge detections by looking over multiple cycles.

Once it has been confirmed that one or more edges has been detected, an analysis section then consults Table 1 to work out which one of the six scenarios is occurring, based on the number of edges, the order of the edges and the real power delta (change in real power).

Finally, in step S60, the analysis section can now identify the specific load that has changed state.

One can calculate the effective RMS voltage based on the two firing angles, using equation (1) above. Alternatively, one could use a look up table if so desired to ease computation at the expense of memory. Finally, by substituting the effective RMS into equation (5), one can calculate the nominal full power of the load.

Knowing the full power of the load allows us to identify the specific appliance/class of appliance that has changed state— e.g. 100 W light bulb on dimmer. Secondly, one can iterate through each appliance of that class that is currently known (in the data store 28) to establish which of those could have changed to the new measured state, based on it's current state. For example, suppose that we have identified that we are in 'scenario 3—increase in power.' That means that the only appliances that can have changed state are those that are currently in a dimmer mode. Finally, one can match up the firing angles to identify the specific appliance—e.g. if in scenario 3, then the −ve d/dt edge on the new waveform must match up with the current +ve d/dt edge of the appliance which has changed state. Further information on disambiguating identified appliances is given in Table 2.

It is likely that having iterated through the algorithm, there may be more than one contender, each with a measured 'likelihood,' which may be a probability, or may be a possibility measure. These may be then combined with the scores from other classifiers using a master classifier, which may be (but not exclusively) for example a Bayesian engine, or a Neural Net. If no match with a known appliance is found, then a new appliance entry can be made in the data store 28 for future use.

Following the analysis, in this example, the processor produces a log of the electrical energy utilisation for each appliance (step S70 of FIG. 6), comprising total energy consumption, time of day and duration of each usage. This information is output by the output section 40 to the user terminal 42 (such as a PC or a dedicated device for utility-use feedback) so that the information can be conveniently presented to the user.

Purely Resistive Devices with Relatively Constant Steady-State Loads (e.g. Heaters)

Using the basic coefficient information from the electricity supply signals together with inference techniques can successfully discriminate between a large number of different appliances 12. However, there can still be a problem with distinguishing between appliances with similar electrical characteristics, for example, those which present essentially a purely resistive load and have a heating function, such as space heaters, kettles, toasters, irons, cooking hobs, ovens, tumble dryer heating elements, water heaters and so on. These loads are purely resistive, so there is no phase angle information between the current and voltage to distinguish between them, and there is a considerable overlap in the magnitude of the power consumption of different appliances within this class. The present invention is particularly concerned with discriminating between these appliances. As will be explained below, the invention can also be used to assist in determining what type of appliance each unknown resistive appliance is likely to be, for example to identify that a particular unknown appliance is a kettle. This information can then be used to identify the kettle in future with a higher degree of accuracy.

Figure 7:
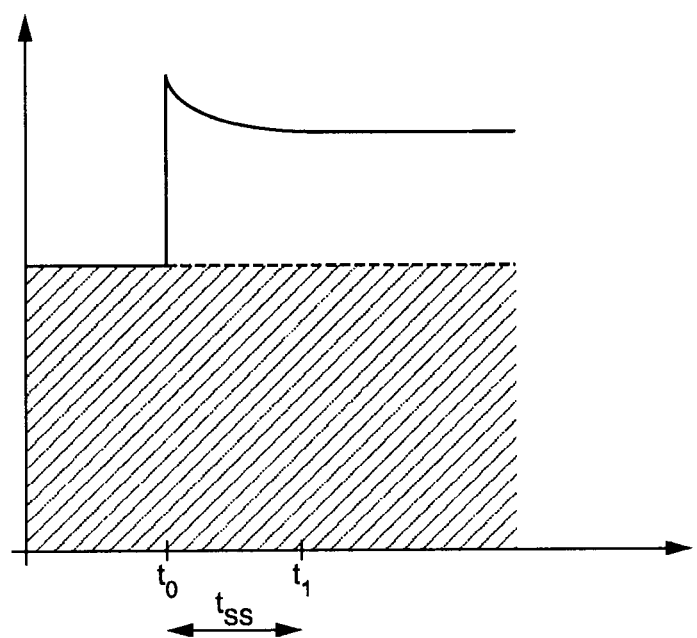

FIG. 7 is a graph of electrical power consumption (vertical axis) as a function of time (horizontal axis) for a particular installation, such as a house. At time $t_0$ a further appliance is switched on and the power consumption rises extremely rapidly to a peak. The power consumption then falls more slowly to a steady state value. The processor 26 analyses the total power consumption using a transient detector circuit or software module to detect such a large increase in power consumption, for example in excess of 50 watts over one cycle of the alternating current electrical supply and then monitors the power until the magnitude of the gradient (rate of change of power with respect to time) is below a predetermined threshold and identifies that as the time $t_1$ at which a new steady state has been reached. The time from $t_0$ to $t_1$ is denoted $t_{ss}$ in FIG. 7, i.e. $t_{ss}$ is the time from switching on the new appliance until a substantially steady state has been reached.

The shaded area in FIG. 7 represents the base load, i.e. the power consumption by other appliances. This is subtracted from the power values plotted in FIG. 7 to obtain the power consumed by only the appliance that is switched on at $t_0$. One method is to take the base load power as being the measured power immediately prior to $t_0$ and subtract this from each subsequent power value. This assumes the base load is constant. One way to account for a varying base load is to calculate the mean and variation in the base load over a longer period of operation and thus obtain a representative average power which is then subtracted from the measured power. A further possibility is to measure the base load mean and variation also after the further appliance has switched off (by detecting the switch off event) and if this is different from the base load prior to the appliance being switched on, then a linear variation in base load between the on and off events of the appliance under observation can be assumed and accordingly subtracted from the measured total power to obtain the power consumption of the appliance in question.

Figure 8:
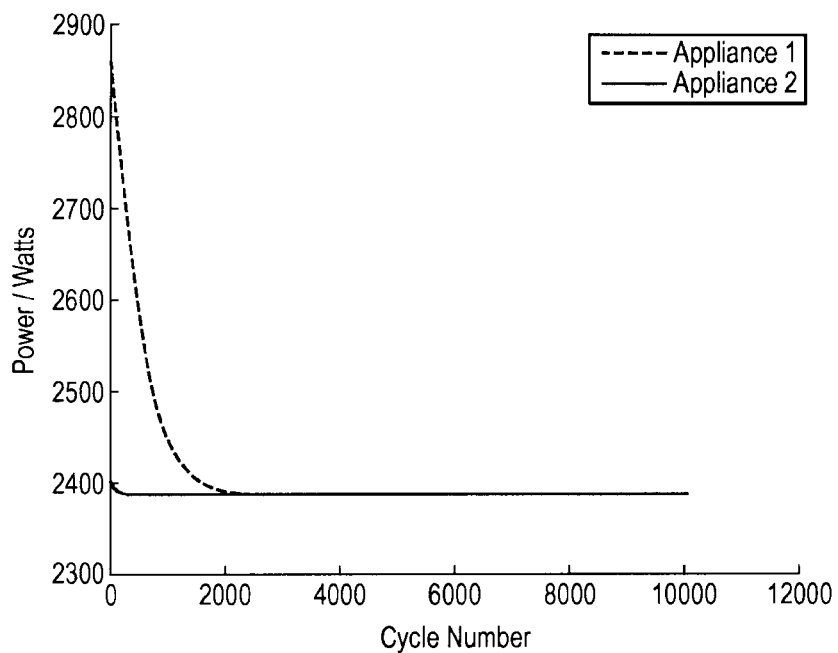
Figure 9:
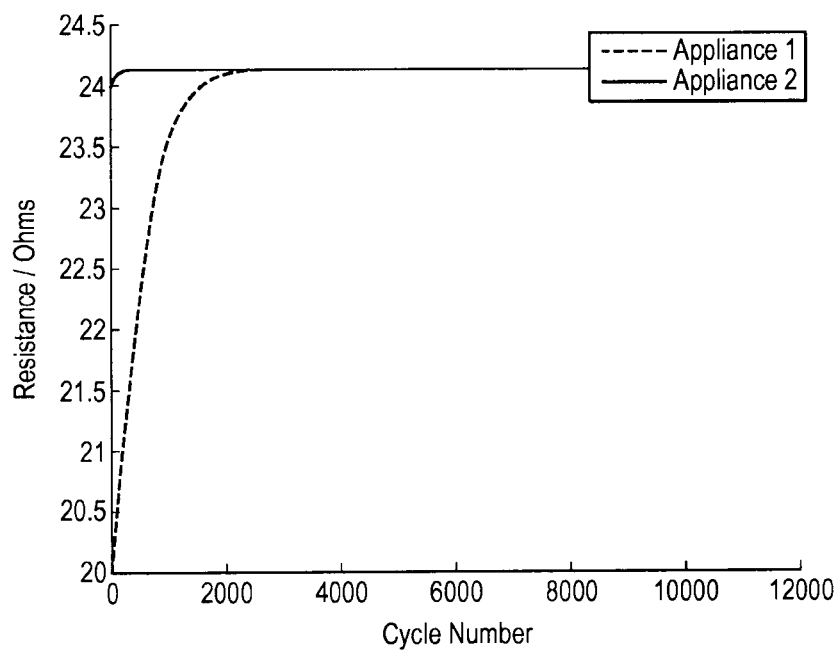

FIG. 8 shows the power consumption for two different appliances after the base load has been subtracted. FIG. 9 is a plot of the corresponding resistance of the appliances which can be obtained by dividing the voltage by the current (for example RMS values over one cycle in each case), or can be obtained by dividing the power by the square of the RMS current. In FIGS. 8 and 9 $t_0$ is at cycle number 0 of the plot, and clearly $t_1$ is significantly different for appliance 1 and appliance 2.

The physical process underlying these graphs is that the resistance of a heating element varies as a function of temperature. When the appliance is switched on, the resistance has a value $R_0$ at time $t_0$. The element then heats up which increases its resistance until it reaches a maximum value $R_1$ at time $t_1$. This occurs when the appliance has reached its steady state operating temperature. This is an equilibrium at which the rate of electrical energy input to the heating element is balanced by the rate of cooling of the element (by conduction, radiation and convection). As can be seen from FIG. 8, both appliances have a steady state power of approximately 2.4 kilowatts and so would be indistinguishable by that parameter alone. However, appliance 1 has much lower heat losses than appliance 2, and so has a higher operating temperature for its heating element and therefore greater change in resistance from its value when cold before being switched on.

The resistance of a heating element is related to its temperature as follows:

$$\frac{\Delta R}{R_0} = \alpha \cdot \Delta T \quad (6)$$

where $R_0$ is the initial resistance of the element, $\Delta R$ is the change in resistance as the element heats up, $\alpha$ is the temperature coefficient of resistivity, and $\Delta T$ is the change in temperature of the element.

In one embodiment of the invention, one coefficient or parameter (also called a classification value) that characterizes the electrical appliance is the ratio $\Delta R/R_0$, where $\Delta R = R_1 - R_0$, i.e. the difference in resistance at between times $t_1$ and $t_0$. For appliance 1 and appliance 2 whose electrical characteristics are given in FIGS. 8 and 9, the value of this ratio is given in Table 3 below.

TABLE 3

| Appliance | $\Delta R/R_0$ |
|---|---|
| Appliance 1 | 0.2061 |
| Appliance 2 | 0.0138 |

Clearly this resistance ratio (fractional change in resistance) can be used to distinguish between appliances that have very similar steady state power consumption. Values of this ratio for different appliances or classes of appliances can be kept in the store 28. Then when an appliance is switched on and a value of the resistance ratio obtained, that value can be included in the inference calculation, along with the other coefficients discussed elsewhere, to produce the most probable estimate of which appliances are on any particular time, and the energy consumption by each appliance. Even when a new appliance is used for the first time, the resistance ratio can be used to identify the class of the appliance (e.g. whether it is a toaster or a kettle) from known values of such appliances in general, without any a priori knowledge of the new appliance itself.

In a further enhancement, one can substitute a value for the temperature coefficient of resistivity $\alpha$ in Equation (6) and then solve directly for the temperature change $\Delta T$ to assist in identifying the appliance. The value of $\alpha$ for nichrome could be assumed because that is the most common heating element material. In fact one can iteratively solve for $\Delta T$ using various common values for $\alpha$ to further increase confidence in the identification of an appliance. For example, having detected what appears to be a light bulb, one could substitute in the value of $\alpha$ for tungsten (as used for incandescent light bulb filaments) and solve for $\Delta T$ in Equation (6). If the resulting $\Delta T$ is around 3000 K, then this supports the inference that the appliance is a light bulb. If $\Delta T$ is 100 K however, then the likelihood is that it is not a light bulb.

Although the specific embodiment described above envisages using the value of the ratio $\Delta R/R_0$ as being characteristic of specific appliances, this is not essential. Ratios of other quantities such as power or current could equally well be used; they are both related to the value of the resistance, which is what is fundamentally physically changing as the heating element of the appliance reaches its operating temperature. Furthermore, in the preferred embodiment, in FIG. 7, the power plotted was the product of the current and voltage; however a simplifying assumption could be made that the voltage is substantially constant and so the power is just directly proportional to the current, and the resistance of the appliance is simply inversely proportional to the current through that appliance, and therefore it is not essential to measure the voltage. A further possibility when considering the power used by an appliance is to base the calculation on the power in the first harmonic of the alternating supply rather than the total power.

Another alternative is that, instead of determining the time $t_1$ when the current, power or resistance reaches a steady state, the apparatus simply detects when the appliance switches off and measures the resistance at that point and uses the "switch-off" resistance in place of $R_1$ when calculating $\Delta R$ (or equivalently measures the switch-off current or switch-off power from the from the change in electrical parameters when the appliance switches off and uses those in obtaining mathematically equivalent ratios as the relevant classification values).

Figure 10:
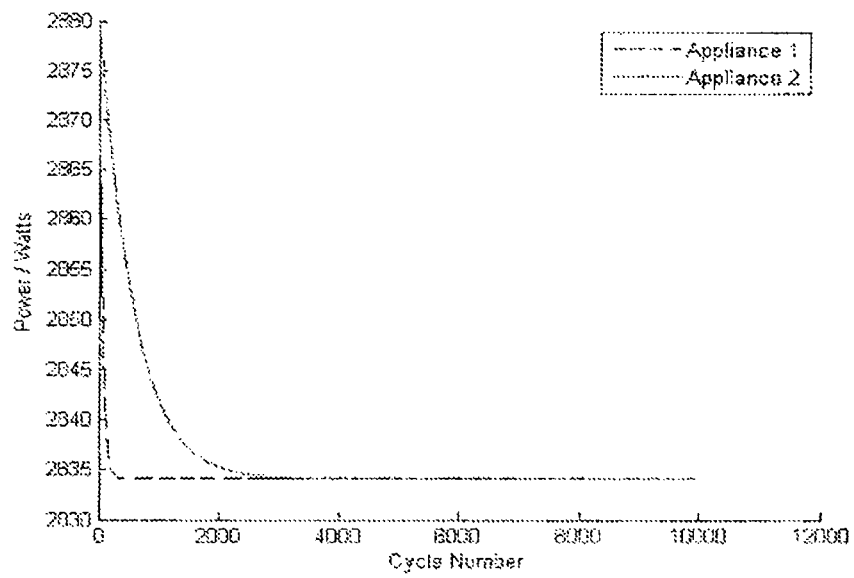

FIG. 10 shows the power profiles for two further appliances which have the same nominal (steady state) power and cooling rates, but still have different profiles. These two appliances could not be distinguished on the basis of steady state power consumption or fractional change in resistance because those values are the same. The difference between these appliances is the thermal mass of the heating element and any other parts of the appliance that are being heated. For example, the effective thermal mass of an electric iron which has a large heating plate heating element is much greater than that of, for example, a toaster, which has a small heating element. Again, looking at it physically, the heat energy added to a system is related to the change in temperature of that system as follows:

$$Q = cm\Delta T \quad (7)$$

where Q is the net heat energy added to the system, c is the specific heat capacity of that system, m is the mass of the material heated, and $\Delta T$ is the change in temperature of the system.

In the case of an electrical appliance, the net heat energy added, Q, is equal to the integral with respect to time of the power supplied minus the heat lost through all cooling mechanisms. Although the electrical energy supplied can be obtained by integrating the electrical power from the electrical measurements, and $\Delta T$ can be approximated from Equation (6) from the resistance ratio and by assuming a value for $\alpha$ from known material properties (most heating elements are nichrome), the product c·m cannot be solved because the heat losses from the appliance are unknown and would generally be difficult to model because of their dependence on complex processes and their variation as a function of temperature.

Figure 11:
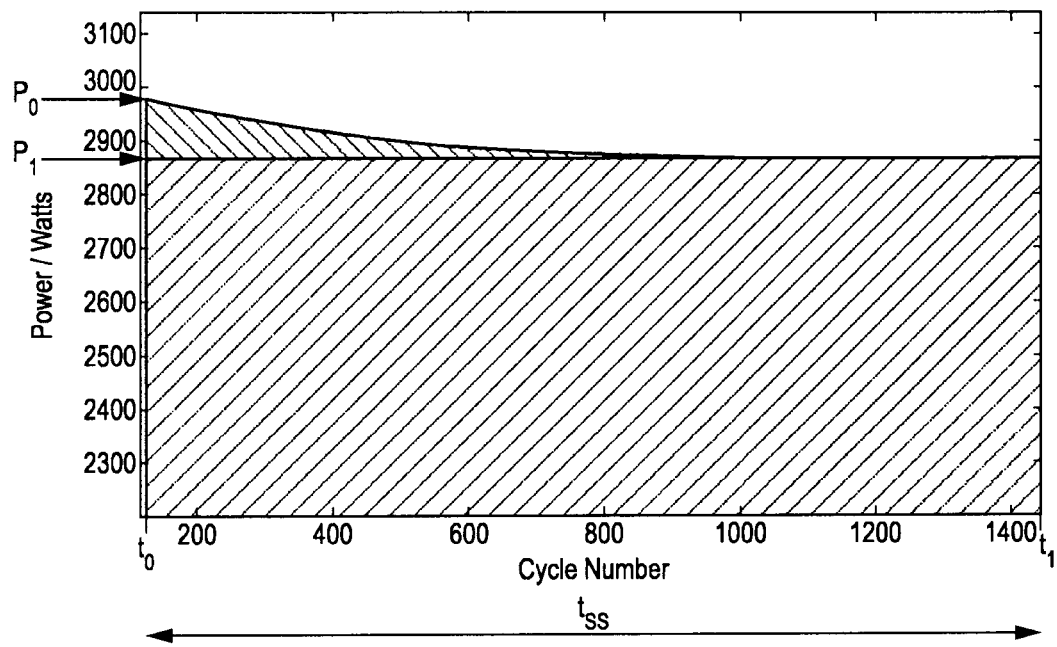
FIG. 11 is a graph of power consumption for an appliance from the time it is switched on until it reaches a steady operating state.

However, according to a further embodiment of the invention, a classification value that is related to the thermal mass (c·m) and serves as a suitable classification value with which to discriminate between appliances has been found. This can be used both to identify the type of appliance (e.g. whether it is a toaster or a kettle) and to act as a further classification value to detect every time that particular appliance is turned on. Referring to FIG. 11, this shows the electrical power drawn by an appliance from the time of switch on $t_0$ to the time $t_1$ at which a steady state is reached, this total time being $t_{ss}$. Although plotted in terms of number of cycles, the physical time in seconds is directly proportional to the number of cycles of the alternating supply. The dark-shaded, approximately triangular area at the top of the graph is the area of interest according to this embodiment of the invention. This area provides a signature or classification value that can conveniently be used to distinguish between appliances, even when their steady-state power consumption $P_1$ is substantially the same. Crudely speaking, the dark-shaded area is related to the excess energy that must be supplied to the appliance over and above the energy required to maintain a steady state when the appliance is at its operating temperature. This area is related to the energy required to heat up the appliance, which in turn is related to the thermal mass of the system (product of the physical mass and the specific heat capacity).

One way to calculate this area is as follows: following the detection of an "on event" for a resistive appliance by the transient detector, the processor 26 starts to integrate the power with respect to time. When the power has stabilised (reached a steady state at which its gradient is below a threshold value), integration is stopped. The integral value obtained gives the total area under the curve. The lower rectangular area is calculated by multiplying the final steady-state power $P_1$ by the integration time ($t_{ss}$) and this is then subtracted from the total integral value to obtain the dark-shaded area of interest. This area is then used as a classification value along with some or all of the other values and coefficients defined above to determine which appliance was switched on and ultimately to calculate the energy consumed by that appliance.

The above example is simply one way of calculating the area to obtain a classification value. Other methods could equally be used, for example by approximating the shape as a triangle and calculating the area as:

$$\frac{1}{2} t_{ss} (P_0 - P_1)$$

or by other methods that seek to approximate the shape of the transient by fitting an approximate curve, and then integrating that, or other numerical integration techniques.

Furthermore, although in the above description the integration to find the area as a classification value is carried out on the real power, it could alternatively be carried out on the power in the first harmonic, or the power where the voltage is assumed to be constant (so the power is just related to the current, and would be equivalent to integrating the RMS current), or other derivations, such as equivalent areas on the resistance or impedance curves which are mathematically equivalent and related to the electrical energy supplied to the appliance in excess of that required to maintain the steady state.

Another classification value that can be used in the inference by the processor 26 is the time $t_{ss}$ until steady state is reached, and also the steady state power itself. These, together with the other appliance characteristics such as time of day of use, duration of use, frequency of use and so on enable appliances with resistive loads to be uniquely identified.

It is not necessary to calculate the full set of classification values or appliance signatures every time that the appliance turns on, and indeed this may not always be possible if a further appliance is turned on while the first appliance is still warming up, such that the two transients overlap. However, the switch on power ($P_0$) and the steady state power ($P_1$ or equivalently the power at switch-off) can be measured in a single cycle of the alternating electricity supply independently of the base load or other appliance transients. Therefore, in these circumstances, these power levels can be assigned as belonging to "appliance A". In future, once the full transient information has been measured and the appliance has been classified, then a search through the local database will show that appliance A is in fact, for example, a kettle, and the energy consumption information can be updated accordingly. This inference can be reliable because in a typical house there are only a relatively small number of appliances of any particular type, and the set of appliances in the house does not change frequently. Therefore, once it has been established that a particular appliance is present, then it would be very unlikely that there is another appliance in the house that has exactly the same switch on power and steady state power levels.

A further enhancement is to take into account the cooling down of a resistive appliance after it turns off (either as a result of the natural end of its cycle of use, or as part of a thermostatic control). As it cools, its resistance will decrease. Then if it turns on again, before it has completely cooled down to ambient temperature, the measured resistance will be somewhere between the normal operating resistance $R_1$ and the cold resistance $R_0$. By monitoring appliances over time, the processor 26 will be able to deduce the rate of cooling and thus, when a switch on transient event is detected, be able to determine whether this is a new appliance switching on, or whether it is the previous warm appliance switching on again, based on the time since that appliance last switched off.

Following the analysis, in this example, the processor produces a log of the electrical energy utilisation for each appliance, comprising total energy consumption, time of day and duration of each usage. This information is output by the output section 40 to the user terminal 42 (such as a PC or a dedicated device for utility-use feedback) so that the information can be conveniently presented to the user.

According to a further embodiment of the invention, one or more of the appliances 12 connected to the supply wiring 14 can be a generator of electrical power, for example a solar photovoltaic panel or a wind turbine generator. As these devices generate power, which is either fed to other appliances 12, or even back to the supply utility 10, then the current and voltage detected by the sensor 16 would also change, and the processor 26 can perform exactly the same analysis based on appliance data stored in the store 28 to determine when each device is generating power and the quantity generated. This gives convenient feedback about the precise savings achieved by using the solar panel or wind turbine, and also information about optimal siting of such devices.

In the embodiments of the invention described in this section ("Purely resistive devices with relatively constant steady-state loads") and the previous section ("Variable power predominantly resistive loads"), only electrical energy is measured and discussed. However, the meter could be concerned with two or more utilities, for example additionally measuring water and/or gas consumption to improve inference of which appliances are in use at a particular time; in general the meter may aggregate information about multiple utilities to improve confidence in the inferred usage (for example by particular appliances) of each one of the utilities. This idea is explored further in the "Multi-utility analysis" section below.

Multi-Utility Analysis (e.g. Analysis of Both Electricity and Water Usage)

Figure 12:
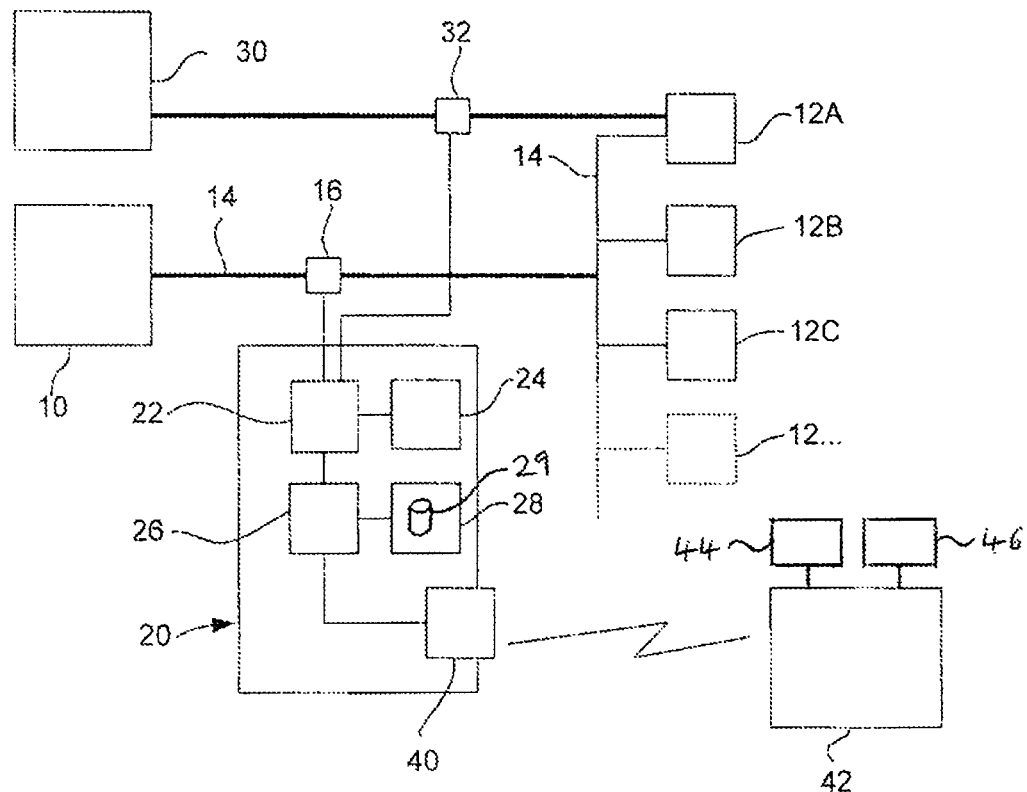
FIG. 12 depicts schematically a system using a utility meter apparatus according to an embodiment of the invention.

An apparatus, referred to as a utility meter, according to an embodiment of the invention will now be described. FIG. 12 shows the hardware components of a system incorporating the utility meter 20. In this embodiment, the invention is applied to an electricity supply system, by way of example, and so the utility in question is electricity, or more correctly, electrical energy. Many of the components shown in FIG. 12 are similar to those shown in FIG. 1. Therefore, these will not be described again here since the same reference numerals have been used in each case.

Using the intrinsic information in the electricity supply signals together with inference techniques can successfully discriminate between a large number of different appliances 12. However, there can still be a problem with distinguishing between appliances with similar electrical characteristics. For example, consider an electric room heater and a so-called "power shower" (which uses electricity to instantaneously heat water for a shower) of the same power rating in terms of kiloWatts; both are essentially purely resistive loads and draw the same current. Similarly, consider a washing machine and a tumble dryer; each has a resistive heating element and an electric motor for rotating a drum under a similar load. The present invention uses information on the use of another utility to assist in distinguishing between use by such similar appliances, or to increase the confidence that the correct inference has been made regarding the state of the appliances, as will now be described.

In the embodiment of the invention shown in FIG. 12, the appliance 12A, such as a washing machine or power-shower, is connected to the supply 30 of another utility, in this case water. A water meter 32 detects the flow of water and conveys values representative of use of water to the input section 22 of the utility meter 20. These values are used in the inference performed by the processor 26, in conjunction with known characteristics of the appliances 12 read from store 28, and the electrical information as already described above, to generate an improved inference of the state of the appliances 12, or an inference with greater confidence that the assessment is correct. For example, if it is detected from the current measurements that an electrical appliance is consuming a particular amount of power, and simultaneously there is a flow of water corresponding to that of a power-shower, then the probability is high that the electrical power is being supplied to a power-shower. Conversely, if the same electrical power consumption by an appliance is determined, but in the absence of the water flow, then the inference will be that a different electric heater is in use.

Although not shown in FIG. 12, the water can be supplied to multiple appliances, some of which also use electricity, and some of which do not use electricity. By including the water usage information in the inference analysis, the state of the electrical appliances can be derived with greater accuracy (for example because different appliances uses different flow rates of water, and some none at all, and such characteristic data is included in the store 28). Similarly, the inference can be performed the opposite way round such that the knowledge of electricity usage can enable or improve determination of which appliances are using water. Effectively the available utility usage information is aggregated, and used in the overall inference of the present state of all appliances, and can be used to refine the previous estimates of the past states of the appliances. In this way, the utility meter 20 can act as a combined meter for multiple utilities.

The invention is not limited to the utilities comprising the pair of water and electricity. For example, gas and electricity could be monitored. If it is inferred from gas flow data that a gas hob is being used, and also that some electric appliances are switched on, then it would be more probable that the electric appliances are associated with the kitchen, for example an extractor hood or kitchen light, rather than say a bathroom extractor fan or light. In this way the confidence of the assessment of which appliances are in use can be improved. The general principle is that values representing the use of a first utility, such as water or gas, are used to determine information on the usage of a second utility, such as electricity, or vice versa.

The stored appliance characteristics data is not just limited to flow rates of water or gas, but could include, for example, typical total consumption per use of appliances, the time of day of their usage and the duration of typical usage. Therefore, even by measuring just the flow rate, discrimination can be made on a probabilistic basis, between, say, running a shower in the middle of the night (unlikely) compared with using a washing machine programmed to operate overnight (more likely).

Following the analysis, in this example, the processor produces a log of the electrical energy utilisation for each appliance, comprising total energy consumption, time of day and duration of each usage. This information is output by the output section 40 to the user terminal 42 (such as a PC or a dedicated device for utility-use feedback) so that the information can be conveniently presented to the user.

Figure 13:
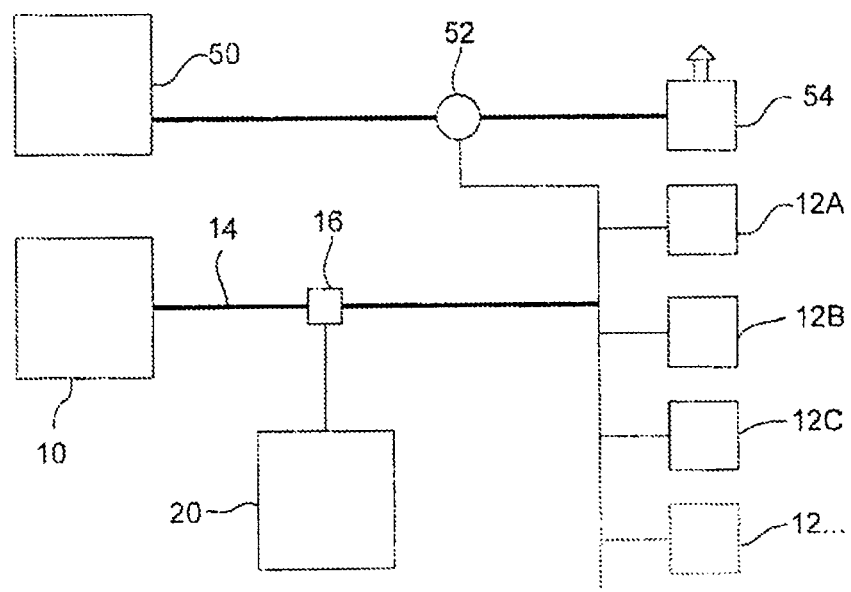
FIG. 13 depicts schematically a system using a utility meter apparatus according to another embodiment of the invention.

Another embodiment of the invention will be described with reference to FIG. 13 in which the same reference numerals indicate the same parts as in FIGS. 1 and 12. In this case oil is supplied from a supply 50, such as an oil storage tank, via a pump 52 to an oil-burning heater 54, such as a domestic central heating boiler. The utility meter 20 calculates when the pump 52 is operating, from its electrical characteristics and so forth, in the same way as for any other appliance 12 connected to the electricity supply 10. From this operating information and known calibration characteristics of the pump 52, the amount of oil delivered to the heater 54 can be derived. In this way it is not necessary to provide a separate oil meter, and the utility meter 20 can act as a combined utility meter. Again this embodiment uses the general principle that values representing the use of a first utility, in this case electricity, are used to determine information on the usage of a second utility, in this case oil.

In the embodiments of the invention described in this section ("Multi-utility analysis"), pairs of utilities are discussed, but the invention is not intended to be limited to only two utilities. The utility meter could be concerned with more than two utilities; for example measuring two utilities to derive information about usage of a third utility, or measuring one utility to infer information about the usage of two others, or in general aggregating information about multiple utilities to improve confidence in the inferred usage (for example by particular appliances) of each one of the utilities.

The first stage in using the meter is the analysis stage as already described in the three sections above to identify which appliances are being used at any particular time and how much of the or each particular utility they are consuming. The second stage is to provide the user with short-term feedback via the user terminal 42. For example, if the user terminal is a dedicated device in a prominent place in the house, it could give immediate feedback, for example that a particular appliance was left on overnight when that is not usual. It could also highlight changes in the behaviour of appliances, for example if an electric water heater were running more frequently than usual, then the thermostat might be faulty, or if the energy consumption by a refrigerator or any other appliance showed an increase above an expected level, then the user terminal could suggest that the appliance needs servicing. Other examples of instant feedback, for utilities other than electricity, might include warning the user that a tap has been left running, or that a valve in a toilet cistern needs replacing, or that a gas appliance has inadvertently been left on.

A further use of the apparatus is to change the way billing is done, by acting as a "smart meter". The data from the meter 20 can be transmitted automatically to a central unit via radio frequency/mobile links which would eliminate the necessity for manual reading of a meter and would also eliminate estimation of meter readings. Billings and hence feedback can be carried out more frequently which also has a positive impact on reducing the quantity of energy being consumed.

A third stage in the use of the apparatus is long-term feedback. For example, the user can perform trend analysis with the user terminal 42, particularly if it is a personal computer. The user can assess what behavioural changes have made the greatest impact on reduced consumption; the user can compare his energy usage profile with other users of similar sized properties, and communities of users can engage in interactive activities, such as exchanging tips on reducing usage and also in introducing a competitive element to achieve the greatest reductions.

'Micro generation' is a growing phenomenon where homeowners can install electricity generating equipment in their residence and use it to provide some or all of the electricity generating needs. The non-intrusive load monitoring (NILM) solution described herein can complement a micro generation installation.

A micro-generation system supplies energy into the house and thus can be metered by a NILM device since it will modify the aggregate current waveform measured by the meter in an analogous way to any other appliance, the difference being that the meter will see a drop in power consumed by the house due to the generation. Thus, one could look for a change in power in the house and measure the change in 'signature' and thus identify the source of the change in power.

The primary benefit of this is that most micro generation systems rely on a secondary electricity meter between the generator and the rest of the electricity supply to measure the amount of electricity generated (either for resale back to the grid, or for home energy management). This secondary electricity meter would be redundant and could be removed in the case that a NILM was installed, since the NILM of the present invention could measure the energy accurately without the need for a separate device.

Thus, according to a further embodiment of the invention, one or more of the appliances 12 connected to the supply wiring 14 can be a generator of electrical power, for example a solar photovoltaic panel or a wind turbine generator. As these devices generate power, which is either fed to other appliances 12, or even back to the supply utility 10, then the current and voltage detected by the sensor 16 would also change, and the processor 26 can perform exactly the same analysis based on appliance data stored in the store 28 to determine when each device is generating power and the quantity generated. This gives convenient feedback about the precise savings achieved by using the solar panel or wind turbine, and also information about optimal siting of such devices.

To further increase the accuracy, it is possible to fit a low cost sensor (not shown) next to the micro-generation system which would provide additional information to the NILM. For example, in the case of a solar generation system, one could fit one or more photodiodes next to the main solar array which would feed back to the NILM. Thus changes in power could be correlated to both the changes in power signature and changes in the observed change in reading from the photodiode.

Advanced load management is also possible when the present invention is used in conjunction with a micro-generation system. The NILM has information pertaining to the energy consumption or generation of every appliance in a distribution network. Hence, it is able to coordinate energy usage in the home automatically. For example, in the case that an electric car required recharging, it could be plugged in to the wall at which point the NILM would detect it and choose whether to switch it off, waiting for a point when there is sufficient micro-generation capability available to charge the car.

Although preferred embodiments of the invention have been described, it is to be understood that these are by way of example only and that various modifications may be contemplated.

What we claim is:

1. A variable power load detector apparatus, for use in a non-intrusive electrical load meter for metering the use of electricity supplied to a plurality of loads, the electricity supply providing an alternating voltage supply and an electrical current supply, the apparatus comprising:
   an input section arranged to receive values representative of the total instantaneous supply of at least one of electrical current and power to the plurality of loads as a function of time from the alternating voltage supply, the received values comprising a set of waveform values representative of a cyclic waveform of at least one of the electrical current and power supply, the total instantaneous supply of at least one of electrical current and power to the plurality of loads having been received without direct access to the plurality of loads;
   a delta waveform generator arranged to calculate a difference between a cyclic waveform and an earlier cyclic waveform, by subtracting the respective sets of waveform values, to obtain a delta waveform;
   an edge detector arranged to detect an edge or edges in the delta waveform; and
   an analysis section arranged to identify at least one load based at least on information on the edge or edges detected by the edge detector.

2. Apparatus according to claim 1, further comprising an event detector arranged to detect an event representing a change in the total electrical energy being supplied per cycle; and
   wherein the delta waveform generator is arranged to calculate the difference between the current waveforms before and after the detected event.

3. Apparatus according to claim 1, wherein the edge detector is further arranged to determine information on the gradient of at least one of the edges.

4. Apparatus according to claim 1, wherein the edge detector is further arranged to determine information on the position of any edges in the delta waveform.

5. Apparatus according to claim 4, wherein the analysis section is further arranged to determine the nominal full power of the at least one load based on the position of at least one detected edge.

6. Apparatus according to claim 1, wherein the edge detector is further arranged to determine information on the number of edges in the delta waveform.

7. Apparatus according to claim 1, wherein the analysis section is further arranged to identify at least one load based on the presently known powers of loads known to the apparatus.

8. Apparatus according to claim 1, wherein the analysis section is arranged to determine the electrical energy consumed individually by each load.

9. Apparatus according to claim 1, wherein the edge detector is arranged to:
   correlate the delta waveform with at least a subset of basis waveforms, each basis waveform having a known edge or edges;
   identify the basis waveform corresponding to the highest correlation coefficient; and
   detect an edge or edges in the delta waveform based on the known edge or edges in the identified basis waveform.

10. Method for detecting a variable power load, for use in non-intrusive electrical load metering for metering the use of electricity supplied to a plurality of loads, the electricity supply providing an alternating voltage supply and an electrical current supply, the method comprising:
    receiving values representative of the total instantaneous supply of at least one of electrical current and power to the plurality of loads as a function of time from the alternating voltage supply, the received values comprising a set of waveform values representative of a cyclic waveform of at least one of the electrical current and power supply, the total instantaneous supply of at least one of electrical current and power to the plurality of loads having been received without direct access to the plurality of loads;
    generating a delta waveform by calculating a difference between a cyclic waveform and an earlier cyclic waveform, by subtracting the respective sets of waveform values to obtain a delta waveform;
    detecting an edge or edges in the delta waveform; and
    identifying at least one load based at least on information on the detected edge or edges.

11. Method according to claim 10, further comprising detecting an event representing a change in the total electrical energy being supplied per cycle; and
    wherein the delta waveform is calculated as the difference between the current waveforms before and after the detected event.

12. Method according to claim 10, further comprising determining information on the gradient of at least one of the edges.

13. Method according to claim 10, further comprising determining information on the position of any edges in the delta waveform.

14. Method according to claim 13, further comprising determining the nominal full power of the at least one load based on the position of at least one detected edge.

15. Method according to claim 10, further comprising determining information on the number of edges in the delta waveform.

16. Method according to claim 10, further comprising identifying at least one load based on the presently known powers of loads being supplied with electricity.

17. Method according to claim 10, wherein the current waveforms are determined for the whole or half of a cycle of the alternating electricity supply.

18. Method according to claim 10, wherein at least one current waveform is an average over a plurality of cycles of the alternating electricity supply.

19. Method according to claim 10, wherein at least one load has its power varied by a controlled switch; said controlled switch comprises a TRIAC, an SCR or a thyristor.

20. Method according to claim 10, further comprising determining the electrical energy individually consumed by each load.

21. Method according to claim 10, wherein the step of detecting an edge or edges in the delta waveform comprises: providing a set of basis waveforms, each basis waveform having a known edge or edges;
    correlating the delta waveform with at least a subset of the basis waveforms; identifying the basis waveform corresponding to the highest correlation coefficient; and detecting an edge or edges in the delta waveform based on the known edge or edges in the identified basis waveform.

* * * * *